(12) United States Patent
Verhaverbeke et al.

(10) Patent No.: US 7,469,883 B2
(45) Date of Patent: Dec. 30, 2008

(54) CLEANING METHOD AND SOLUTION FOR CLEANING A WAFER IN A SINGLE WAFER PROCESS

(75) Inventors: Steven Verhaverbeke, San Francisco, CA (US); Kelly Truman, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/497,025

(22) Filed: Jul. 31, 2006

(65) Prior Publication Data

US 2006/0270242 A1    Nov. 30, 2006

Related U.S. Application Data

(62) Division of application No. 11/145,304, filed on Jun. 3, 2005, which is a division of application No. 09/891,730, filed on Jun. 25, 2001, now Pat. No. 6,927,176.

(60) Provisional application No. 60/214,116, filed on Jun. 26, 2000.

(51) Int. Cl.
  *B01F 3/04* (2006.01)
(52) U.S. Cl. ............ 261/102; 261/105; 261/DIG. 7
(58) Field of Classification Search ............ 261/100, 261/102, 104, 105, 107, DIG. 7
  See application file for complete search history.

(56) References Cited

U.S. PATENT DOCUMENTS

| | | | |
|---|---|---|---|
| 3,045,702 A | 7/1962 | Nakata | |
| 3,291,347 A | 12/1966 | Blades | |
| 4,243,071 A | 1/1981 | Shackelford | |
| 4,554,050 A | 11/1985 | Minford et al. | |
| 4,671,852 A | 6/1987 | Pyke | |
| 4,817,652 A | 4/1989 | Liu et al. | |
| 4,899,767 A | 2/1990 | McConnell et al. | |
| 5,071,547 A | 12/1991 | Cazer et al. | |
| 5,134,445 A | 7/1992 | Toge | |
| 5,254,143 A | * | 10/1993 | Anazawa et al. ............ 95/46 |

(Continued)

FOREIGN PATENT DOCUMENTS

EP    496605 A2    7/1992

(Continued)

OTHER PUBLICATIONS

Clearly the Standard Online Newsletter, Pall Corporation, Spring/Summer 2000.*

(Continued)

*Primary Examiner*—Scott Bushey
(74) *Attorney, Agent, or Firm*—Blakely Sokoloff Taylor & Zafman, LLP

(57) ABSTRACT

The present invention is a novel cleaning method and a solution for use in a single wafer cleaning process. According to the present invention the cleaning solution comprises ammonium hydroxide ($NH_4OH$), hydrogen peroxide ($H_2O_2$), water ($H_2O$) and a chelating agent. In an embodiment of the present invention the cleaning solution also contains a surfactant. And still yet another embodiment of the present invention the cleaning solution also comprises a dissolved gas such as $H_2$. In a particular embodiment of the present invention, this solution is used by spraying or dispensing it on a spinning wafer.

8 Claims, 17 Drawing Sheets

U.S. PATENT DOCUMENTS

| | | | |
|---|---|---|---|
| 5,269,838 A | 12/1993 | Inoue et al. | |
| 5,279,704 A | 1/1994 | Saito | |
| 5,302,311 A | 4/1994 | Sugihara et al. | |
| 5,346,302 A | 9/1994 | Ryu | |
| 5,466,389 A | 11/1995 | Ilardi et al. | |
| 5,470,461 A | 11/1995 | Ban et al. | |
| 5,490,611 A | 2/1996 | Bernosky et al. | |
| 5,637,151 A | 6/1997 | Schulz | |
| 5,678,116 A | 10/1997 | Sugimoto et al. | |
| 5,840,127 A | 11/1998 | Hayashida et al. | |
| 5,853,491 A | 12/1998 | Schulz | |
| 5,858,106 A | 1/1999 | Ohmi et al. | |
| 5,882,433 A | 3/1999 | Ueno | |
| 5,885,362 A | 3/1999 | Morinaga et al. | |
| 5,908,509 A | 6/1999 | Olesen et al. | |
| 5,922,136 A | 7/1999 | Huang | |
| 5,938,847 A | 8/1999 | Akimoto et al. | |
| 5,962,384 A | 10/1999 | Cooper et al. | |
| 5,972,123 A | 10/1999 | Verhaverbeke | |
| 5,996,595 A | 12/1999 | Olesen et al. | |
| 6,063,695 A | 5/2000 | Lin et al. | |
| 6,074,935 A | 6/2000 | Ramachandran | |
| 6,132,522 A | 10/2000 | Verhaverbeke et al. | |
| 6,138,995 A * | 10/2000 | Page | 261/43 |
| 6,143,706 A | 11/2000 | Morinaga et al. | |
| 6,152,148 A | 11/2000 | George et al. | |
| 6,158,721 A | 12/2000 | Katou et al. | |
| 6,164,632 A * | 12/2000 | Uchida et al. | 261/102 |
| 6,211,055 B1 | 4/2001 | Peng et al. | |
| 6,265,781 B1 | 7/2001 | Andreas | |
| 6,321,759 B1 | 11/2001 | Okamura et al. | |
| 6,328,905 B1 | 12/2001 | Lebowitz et al. | |
| 6,454,871 B1 * | 9/2002 | Labib et al. | 134/8 |
| 6,517,637 B1 | 2/2003 | Fu et al. | |
| 6,837,941 B2 | 1/2005 | Hirooka et al. | |
| 6,884,634 B2 | 4/2005 | Suzuki et al. | |
| 6,927,176 B2 | 8/2005 | Verhaverbeke et al. | |
| 7,159,599 B2 | 1/2007 | Verhaverbeke et al. | |
| 2002/0102852 A1 | 8/2002 | Verhaverbeke et al. | |
| 2003/0045131 A1 | 3/2003 | Verbeke | |
| 2003/0192428 A1 * | 10/2003 | Cheng et al. | 95/46 |
| 2004/0028602 A1 * | 2/2004 | Franz et al. | 423/648.1 |
| 2004/0063227 A1 | 4/2004 | Tetsuo et al. | |
| 2005/0227888 A1 | 10/2005 | Verhaverbeke et al. | |
| 2006/0260647 A1 | 11/2006 | Verhaverbeke et al. | |
| 2006/0264343 A1 | 11/2006 | Verhaverbeke et al. | |

FOREIGN PATENT DOCUMENTS

| | | |
|---|---|---|
| EP | 560324 A1 | 9/1993 |
| EP | 678571 A2 | 10/1995 |
| EP | 678571 A3 | 1/1997 |
| EP | 789071 A1 | 8/1997 |
| EP | 0860866 A1 | 2/1998 |
| EP | 926714 A1 | 6/1999 |
| EP | 1205968 A2 | 5/2002 |
| JP | 07060082 A | 3/1995 |
| WO | WO 98/34579 * | 8/1998 |
| WO | WO 02/01609 A2 | 1/2002 |

OTHER PUBLICATIONS

Naoaki et al., "Washing Method," Mar. 17, 1998, Computer-generated English translation of JP 10-071375, 11 pages.

Anderegg, Von G., et al., "Hydroxamatkomplexe III.sup.1). Eisen (III)-Austausch zwischen Sideraminen und Komplexonen Diskussion der Bildungskonstanten der Hydroxamatkomplexe," Helvetica Chimica Acta, vol. XLVI, Fasciculus IV (1963)—No. 156, pp. 1409-1422, Basel 7 (Schweiz).

Birus, Mladen, et al., "Iron (III) Complexation by Desferrioxamine B in Acidic Aqueous Solutions. Kinetics and Mechanism of the Formation and Hydrolysis of the Binuclear Complex Diferrioxamine B, Inorganic Chemistry," vol. 23, No. 14, 1984, pp. 2170-2175, © 1984 American Chemistry Society.

Birus, Mladen, et al., "Iron (III) Complexation by Desferrioxamine B in Acidic Aqueous Solutions. The Formation of Binuclear Complex Fiferrioxamine B," Inorganica Chimica Acta, vol. 78 (B6) N. 2, Feb. 1983, pp. 87-92, ©. Elsevier Sequoia/Printed in Switzerland.

Birus, Mladen, et al., Kinetics and Mechanism of Interactions Between Iron (III) and Desferrioxamine B. The Formation and Hydrolysis of Ferrioxamine B in Acidic Aqueous Solution, Croatica Chemica Acta, CCACAA 56 (1) pp. 61-77, Apr. 2007.

Birus, Mladen, et al., "Kinetics of Stepwise Hydrolysis of Ferrioxamine B and of Formation of Diferrioxamine B in Acid Perchlorate Solution, Inorganic Chemistry," vol. 26, No. 7, 1987, pp. 1000-1005, © 1987 American Chemical Society.

Birus, Mladen, et al., "Mechanistic and Equilibrium Study of the Iron (III) Complexation by Deferriferrioxamine B in Aqueous Acidic Solution. Evidence for the Formation of Binuclear Diferrioxamine B, Inorganica Chimica Acta," Bioinorganic Chemistry Articles And Letters, vol. 56(B3), No. 2, Aug. 1981, pp. L43-L44, © Elsevier Sequoia S.A., Lausanne, Printed in Switzerland.

Evers, Ann, et al., "Metal Ion Recognition in Ligands with Negatively Charged Oxygen Donor Groups. Complexation of Fe(III), Ga(III), In(III), Al(III), and Other Highly Charged Metal Ions, Inorganic Chemistry," vol. 28, No. 11, 1989, pp. 2189-2195, © 1989 American Chemical Society.

Gould, Brian, et al., "A Thermodynamic Description of the Binding of Iron to Ferrioxamine B in Aqueous Solutions, Archives Of Biochemistry And Biophysics," vol. 215, No. 1, Apr. 1, 1982, pp. 148-156, © 1982 by Academic Press, Inc., A Subsidiary of Harcourt Brace Jovanovich, Publishers, New York, London, Paris, San Diego, San Francisco, Sao Paolo, Sydney, Tokyo, Toronto.

Harju, Leo, "The Stability Constants Of Some Metal Chelates Of Triethylenetetraminehexaacetic Acid (TTHA)," Analytica Chimica Acta, vol. 50, 1970, pp. 475-489, Elsevier Publishing Company, Amsterdam, Printed in The Netherlands.

Harju, Leo, et al., "Titrations With Complexing Agents Forming Mononuclear And Binuclear Complexes With Metals," Analytica Chimica Acta, vol. 49, 1970, pp. 205-219, Elsevier Publishing Company, Amsterdam, Printed in The Netherlands.

Khan, M.M. Taqui, et al., "Aminopolycarboxylic Acid Complexes of Al(III), Ga(III) & In(III)," Indian Journal of Chemistry, vol. 19A, Jan. 1980, pp. 50-57, published by The Council Of Scientific & Industrial Research, New Delhi, India.

Ma, Rong, et al., "Protonation constants and metal ion binding constants of N,N',- bis (2-hydroxyphenyl)-N,N'-ethylenediaminediacetic acid," Inorganica Chimica Acta, The International Inorganic Chemistry Journal, vol. 209, No. 1, 1993, pp. 71-78, .© 1993 Elsevier Sequoia.

Monzyk, Bruce, et al., "Kinetics and Mechanism of the Final Stage of Ferrioxamine B Aquation in Aqueous Acid," Inorganica Chimica Acta, Bioinorganic Chemistry Articles and Letters, vol. 55 (B2) No. 1 Jan. 1981, pp. L5-L7, © Elsevier Sequoia S.A., Lausanne-Printed in Switzerland.

Monzyk, Bruce, et al., "Kinetics and Mechanism of the Stepwise Dissociation of Iron (III) from Ferrioxamine B in Aqueous Acid," Journal Of The American Chemical Society, vol. 104, No. 18, 1982, pp. 4921-4929, © 1982 American Chemical Society.

Ohman, Lars-Olof, "Equilibrium and Structural Studies of Silicon (IV) and Aluminum (III) in Aqueous Solution. 21. A Potentiometric and .sup.27 Al NMR Study of the System H.sup.+−Al.sup.3+−MoO.sub.4.sup.2-," Inorganic Chemistry, vol. 28, No. 19, 1989, pp. 3629-3632, © American Chemical Society.

Winston, Anthony, et al., "Hydroxamic Acid Polymers. Effect of Structure on the Selective Chelation of Iron in Water, Macromolecules," vol. 11, No. 3, May-Jun. 1978, pp. 597-603, © 1978 American Chemical Society.

Yoshida, Isao, et al., New multidentate ligands. XXI. Synthesis, proton, and metal ion binding affinities of N,N',N'-tris[2-(N-hydroxycarbamoyl)ethyl]-1,3,5-benzenetricarboxamide (BAMTPH), Canadian Journal of Chemistry, vol. 61, No. 12, Dec. 1983, pp. 2740-2744, National Research Council Canada, Printed in Canada by K.G. Campbell Corporation.

Schwarzenbach, Von G., et al., "Hydroxamatkomplexe I. Die Stabilitat der eisen (III)-Komplexe einfacher Hydroxamsauren und des Ferrioxamins B," Helvetica Chimica Acta., vol. XLVI, Fasciculus IV, No. 154, 1963, pp. 1390-1400, Basel 7 (Schweiz).

Valtron Specialty Chemicals for Tomorrow's Technology, VALTRON DP Series Formulated Detergents, 1 page, Mar. 2004.

"Chapter 3—Silicon Wafer Cleaning Procedure," http://www-mtl.mit.edu/CAFE/sop_copy/rca.html, Apr. 24, 2002, 4 pages.

Patent Abstracts of Japan, vol. 004, No. 089 (C-016), Jun. 25, 1980 & JP 55 051427 A (Sakaoka Kazuhiko), Apr. 15, 1980, 1 page.

"Silicon VLSI Technology, Fundamentals, Practice and Modeling," By Plummer, Deal and Griffin, IC Manufacturing-Chapter 4, "Semiconductor Manufacturing-Clean Rooms, Wafer Cleaning And Gettering"-Chapter 4, © 2000 by Prentic Hall, Upper Saddle River, N.J., 16 pages.

Written Opinion for PCT/US 01/41160 mailed Apr. 2, 2004, 7 pages.

2nd Annual International SEMATECH Wafer Cleaning and Surface Preparation Workshop 2000, Apr. 11-12, 2000, Hyatt Hotel, Austin, TX, 24 pages.

John F. Gibson et al., "Chelating Tendencies of N,N.sup.'-Bix (2-hydroxyphenyl)-Ethylenediamine-N,N'-Diacetic Acid", J. Chem. Soc. Dalton Trans, 1992, pp. 1375-1379, XP008000227.

Hitoshi Morinaga et al., "Advanced Alkali Cleaning Solution for Simplification of Semiconductor Cleaning Process", Materials Research Society Symposium Proceedings, Materials Research Society, Pittsburg, PA, vol. 477, 1997, pp. 35-46, XP000978137.

International Search Report and Written Opinion of the International Searching Authority, for PCT/US2006/021503, mailed Dec. 20, 2006, 18 pages.

"Carbonic acid," Wikipedia, the free encyclopedia, http://en.wikipedia.org/wiki/Carbonic_acid; pp. 1-4, 2007.

* cited by examiner

BINDS METAL IONS (HPED) FIG. 3a

(TTHA) FIG. 3b

DESFERRIFERRIOXAMIN B (BAMTPH)

HYDROXIDE
TERMINATED SiO2 FILM

CHEMISORPTION

HYDROPHOLIC SURFACE

CLEANING METHOD AND SOLUTION FOR CLEANING A WAFER IN A SINGLE WAFER PROCESS

This application is a divisional of U.S. patent application Ser. No. 11/145,304, filed on Jun. 3, 2005, which is a divisional of U.S. patent application Ser. No. 09/891,730 filed Jun. 25, 2001, now U.S. Pat. No. 6,927,176, which claims the benefit of U.S. Provisional Application No. 60/214,116, filed Jun. 26, 2000 entitled CLEANING METHOD AND SOLUTION FOR CLEANING A WAFER IN A SINGLE WAFER PROCESS.

BACKGROUND OF THE INVENTION

1. Field of the Invention

The present invention relates to the field of semiconductor processing and more specifically to a cleaning solution and a method of using the cleaning solution in a single wafer cleaning process.

2. Discussion of Related Art

Wet etching and wet cleaning of silicon wafers is usually done by immersing silicon wafers into a liquid. This is also sometimes done by spraying a liquid onto a batch of wafers. Wafer cleaning and etching is traditionally done in a batch mode where several wafers (e.g. 50-100 wafers) are processed simultaneously. A typical cleaning sequence consists of HF-SC1-SC2. HF (HydroFluoric acid) is a dilute HF solution used for etching thin layers of oxide. This is typically followed by the Standard Clean 1 (SC1 solution) that consists of a mixture of $NH_4OH$, $H_2O_2$, and $H_2O$. Sometimes the SC1 solution is also called the APM solution, which stands for Ammonia hydrogen Peroxide Mixture. The SC1 solution is mainly used for removing particles and residual organic contamination. The SC1 solution, however, leaves metallic contaminants behind.

The final solution is the Standard Clean 2 solution (SC2) that is a mixture of HCl, $H_2O_2$, and $H_2O$. Sometimes the SC2 solution is also called the HPM solution, which stands for Hydrochloric acid hydrogen Peroxide Mixture. The SC2 solution is mainly used for removing metallic contamination. The particular sequence of SC1 and SC2 is most often referred to as the RCA (Radio Corporation of America) cleaning sequence. Between the HF, SC1, and SC2 solutions there is usually a DI (de-ionized) water rinse. There is usually a DI water rinse after the SC2 solution.

The total time for a standard clean cycle is on the order of 64-70 minutes as shown in FIG. 1a. The HF step takes approximately 1-5 minutes. The SC1 step typically takes 10 minutes and the SC2 step also typically takes 10 minutes. The intermediate and final DI water rinse steps take about 8-10 minutes. The final drying of the wafers typically takes between 10-15 minutes. Typically 50-100 wafers are processed at the same time. If separate baths are used for different chemicals then after one batch with 50-100 wafers leaves a bath, a new batch 50-100 wafers can be loaded. Usually the rate limiting step is the dryer which takes up to 15 min. This means that roughly every 15 minutes a new batch of either 50-100 can be processed resulting in an overall throughput for the system of between 200-400 wafers per hour, respectively for batches of 50 or 100 wafers.

Because there is a need for shorter cycle times in chip manufacturing, there is a need for a fast single wafer cleaning process. In order to make a single wafer cleaning process economical, the processing time per wafer should be on the order of two minutes. This means the entire HF-SC1-SC2 sequence, which normally requires about 64-70 minutes, must be completed within two minutes and at least within three minutes. Unfortunately, presently it is not possible to perform an SC1-SC2 cleaning sequence in less than two minutes and at least within three minutes. Until now, wet processing is usually done in a batch mode, since the throughput of single wafer processing cannot compete with batch processing.

Thus, what is desired is a method of reducing the SC1 and SC2 cleans from the normal processing time to less than or equal to 1-½ minutes. It is also required to reduce the time necessary for the HF step and the dry. The present invention shows how to reduce the time of the SC1-SC2 sequence from roughly 40 min down to 1-½ min for use in a single wafer fashion and at least less than three minutes for the entire cleaning cycle including HF, cleaning, rinsing and drying.

SUMMARY OF THE INVENTION

The present invention is a method of use of a novel cleaning solution in a single wafer cleaning process. According to the present invention the method involves using a cleaning solution in a single wafer mode and the cleaning solution comprises at least ammonium hydroxide ($NH_4OH$), hydrogen peroxide ($H_2O_2$), water ($H_2O$) and a chelating agent. In an embodiment of the present invention the cleaning solution also contains a surfactant. In another embodiment of the present invention the cleaning solution also includes a dissolved gas such as $H_2$. The same cleaning solution containing ammonium hydroxide, hydrogen peroxide, a chelating agent, and/or a surfactant and/or dissolved hydrogen may also be used in a multiple wafer mode for certain applications. The present invention is also a DI water rinse solution that includes an oxidant and $CO_2$ gas. All of these elements work in combination to improve processing efficiency.

Moreover, the present invention also teaches a method of combining an ammonia hydroxide, hydrogen peroxide, and chelating agent step with a short HF step in a fashion that minimizes process time in a way that the entire method removes aluminum and iron contamination efficiently without etching too much oxide.

BRIEF DESCRIPTION OF THE DRAWINGS

FIGS. 3a-3d are structures of specific chelating agents that are particularly useful in the current invention.

FIG. 7b is a cross sectional illustration of a modified membrane that may be used in the membrane device of FIG. 7a.

DETAILED DESCRIPTION OF THE PRESENT INVENTION

In the following description numerous specific details are set forth in order to provide a thorough understanding of the present invention. One of ordinary skill in the art will understand that these specific details are for illustrative purposes only and are not intended to limit the scope of the present invention. Additionally, in other instances, well-known processing techniques and equipment have not been set forth in particular detail in order to not unnecessarily obscure the present invention.

The present invention is a method, a solution, and a rinse for use in a single wafer cleaning process. The method is specifically useful for single wafer cleaning, but it may also be used in applications where more than one wafer is cleaned at a time. The novel cleaning solution is formulated in such a way as to increase the efficiency of the cleaning process. Both the cleaning solution and the rinsing solution are specifically useful for the removal of ionic metallic impurities and particles during the front of the line semiconductor processing sequence when the active regions of the device are exposed.

The wafer cleaning solution of the present invention consists of the solution resulting from the mixture of ammonium hydroxide ($NH_4OH$), hydrogen peroxide ($H_2O_2$), water ($H_2O$), a chelating agent, and a surfactant. As well known in the art these compounds only dissociate into their respective ions and no chemical reactions occur among these compounds. The ammonium hydroxide ($NH_4OH$), hydrogen peroxide ($H_2O_2$), and water ($H_2O$) are present in concentrations defined by dilution ratios of between 5/1/1 to 1000/1/1, respectively. The ammonium hydroxide/hydrogen peroxide ratio can also be varied between 0.05/1 and 5/1 and in some cases no hydrogen peroxide is used at all. The ammonium hydroxide in this cleaning solution would be from a solution of 28-29% w/w of $NH_3$ to water. The hydrogen peroxide in this cleaning solution would be from a solution of 31-32% w/w of $H_2O_2$ to water.

The purpose of the ammonium hydroxide and the hydrogen peroxide in the cleaning solution is to remove particles and residual organic contaminates from a wafer that comprises a monocrystalline silicon substrate on at least its front end. The purpose of the cleaning solution is also to oxidize the surface of the wafer. According to the preferred embodiment of the present invention the cleaning solution has an alkaline pH level due to the ammonium hydroxide and the hydrogen peroxide of between 9 and 12 and more specifically between 10 and 11.

The purpose of the chelating agent is to remove metallic ions from the wafer. Chelating agents are also known as complexing or sequestering agents. These agents have negatively charged ions called ligands that bind with free metal ions and form a combined complex that will remain soluble. The ligands bind to the free metal ions as follows:

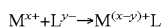

Figure 2A:
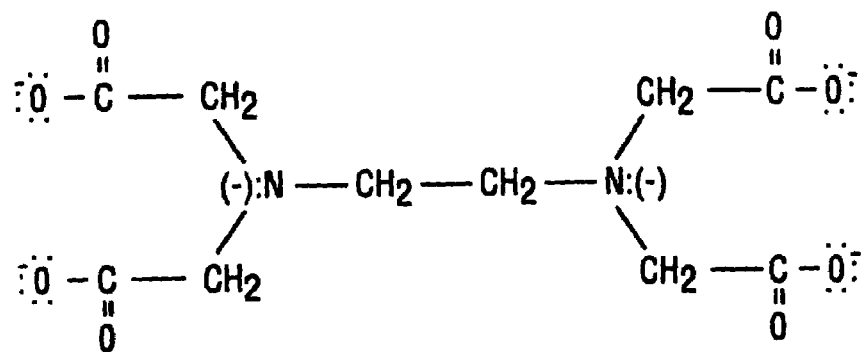
FIG. 2a is a structure of a common chelating agent.
Figure 2B:
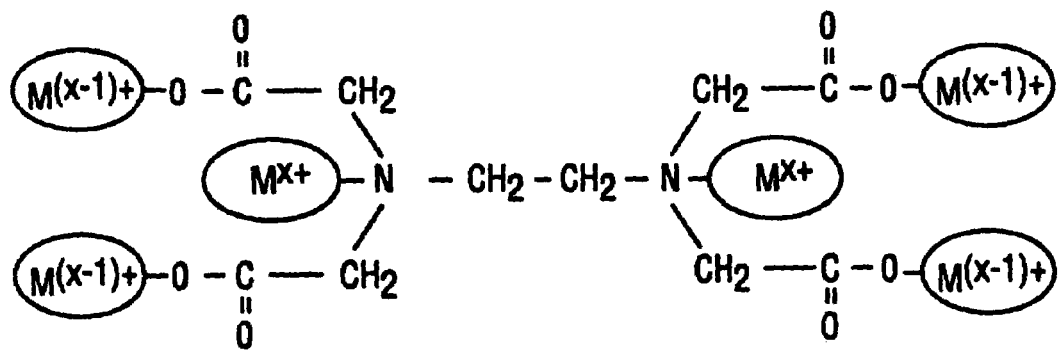
FIG. 2b is a structure of a common chelating agent that has bound metal ions at its ligand sites.

This is demonstrated in FIG. 2a and FIG. 2b with the common chelating agent ethylenediaminetetraacetic acid (EDTA.) In FIG. 2a the EDTA ion is not bound to any metal ions ($M^{x+}$). In FIG. 2b it is shown that one EDTA can bind up to six metal ions ($M^{x+}$). Common metallic ions that would be present on the wafer are copper, iron, nickel, aluminum, calcium, magnesium, and zinc. Other metallic ions may also be present.

Figure 3C:
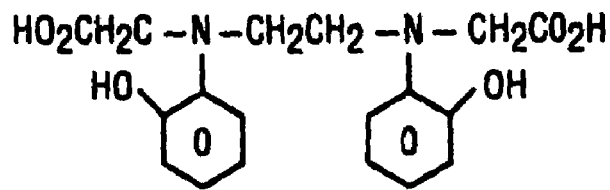
Figure 3C:
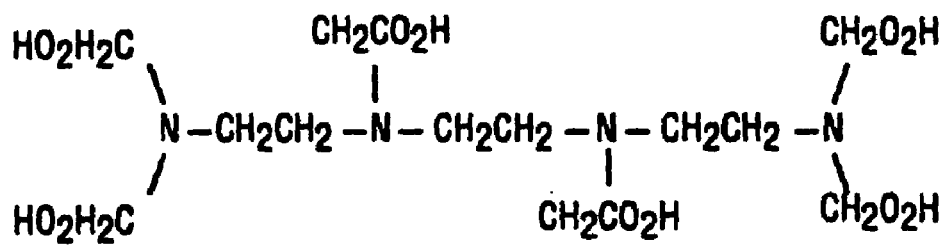
Figure 3C:
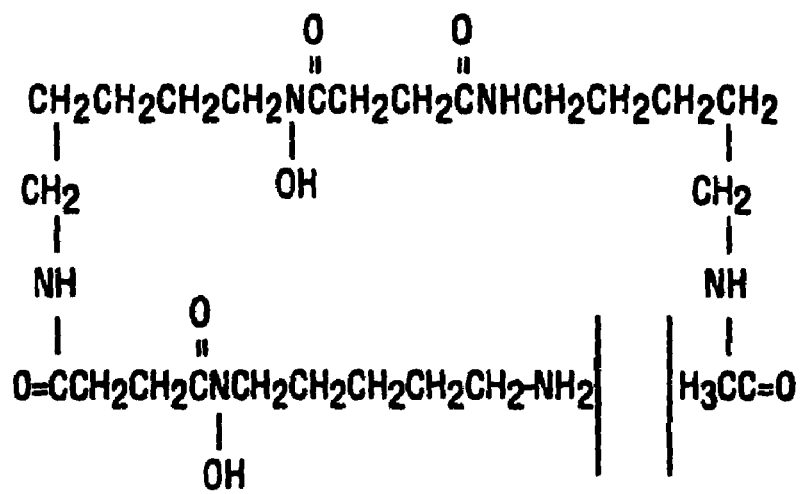
Figure 3D:
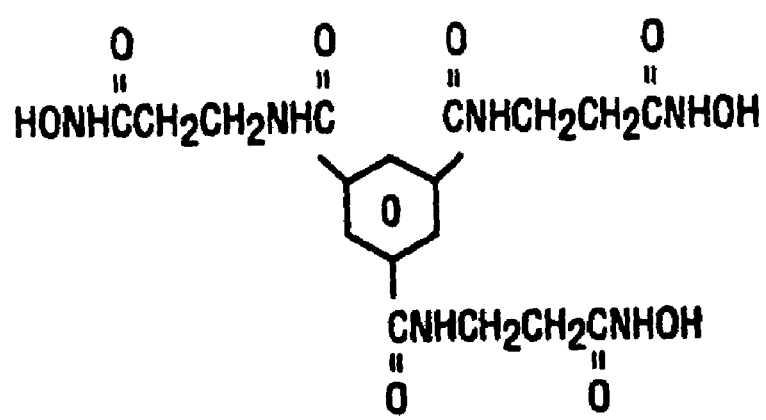

Suitable chelating agents include polyacrylates, carbonates, phosphonates, and gluconates. There are several specific chelating agents that would be particularly useful as part of the cleaning solution. They are: ethylenediaminetetraacetic acid (EDTA) (see FIG. 2a), N,N'-bis(2-hydroxyphenyl)ethylenediiminodiacetic acid (HPED) (see FIG. 3a), triethylenetetranitrilohexaacetic acid (TTHA) (see FIG. 3b), desferriferrioxamin B (see FIG. 3c), N,N',N"-tris[2-(N-hydroxycarbonyl)ethyl]-1,3,5-benzenetricarboxamide (BAMTPH) (see FIG. 3d), and ethylenediaminediorthohydroxyphenylacetic acid (EDDHA). These chelating agents were chosen because they each had an equilibrium constant (K) greater than $10^{15}$, and preferably greater than $10^{20}$ for $Al^{3+}$. These K values were desired because they mean that the chelating agent will be able to remove aluminum from the wafer. The preferred range of concentrations for the chelating agent is between 0.001 mg/l to 300 mg/l and more specifically between 0.01 mg/l to 3 mg/l. Or alternately the chelating agent should be between 1-400 ppm of the cleaning solution, and preferably around 40 ppm of the cleaning solution. These concentrations are suitable because they enable the reduction of free metallic ions by roughly a factor of $10^6$ or higher depending on the metallic ion.

Figure 4A:
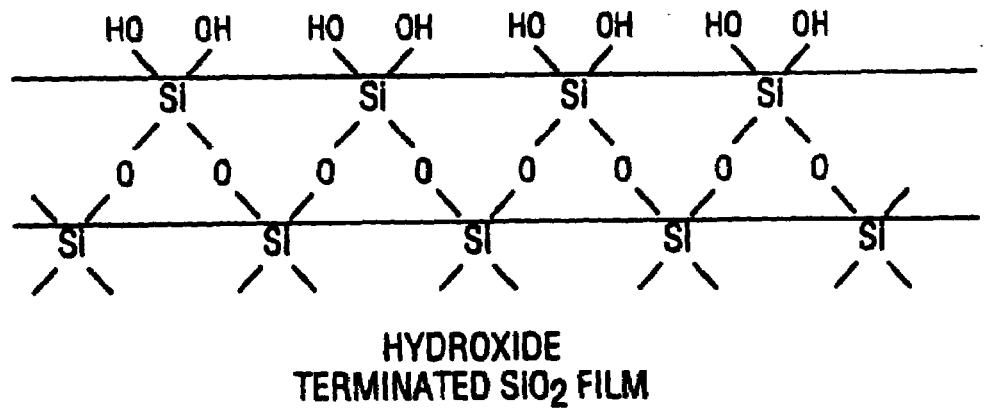
FIG. 4a is an illustration of an hydroxide terminated silicon dioxide film.
Figure 4B:
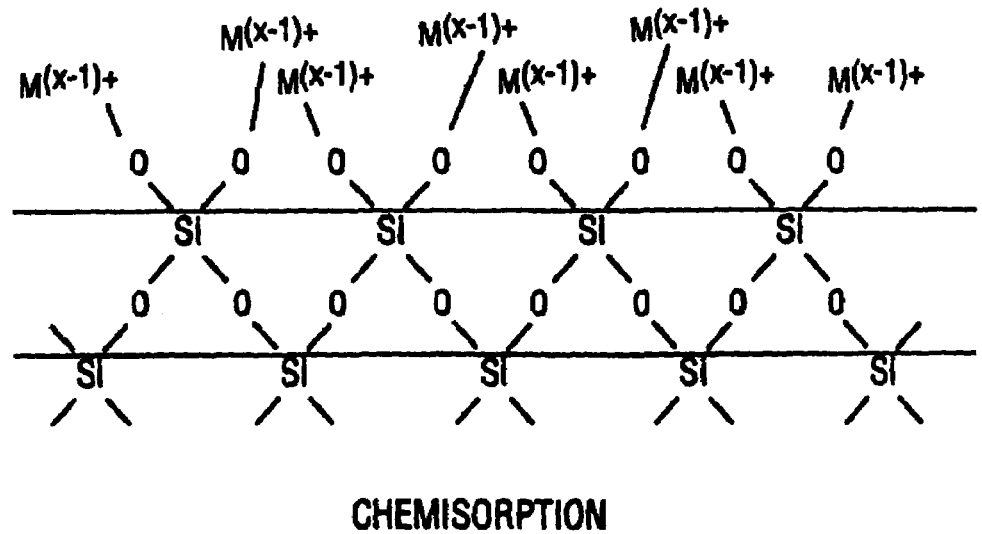
FIG. 4b is an illustration of a silicon dioxide film terminated by metal ions.

During the modified SC1 clean, the surface of the wafer is covered with a silicon dioxide film terminated by hydroxide groups (Si—OH) as shown in FIG. 4a. Metals are bound to this surface as $(Si-O)_yM^{(x-y)+}$ as shown in FIG. 4b. The equilibrium reaction governing the binding (chemisorption) and unbinding (desorption) is described by the following equation:

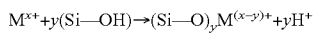

From this equation, one can see that there are two ways to remove metallic ions from the oxide surface. The first way is to increase the acidity [H+] of the solution. This produces a solution where most of the metallic ions that are common in semiconductor processing are soluble provided that there is a suitable oxidizing agent in the solution. Suitable oxidizing agents include $O_2$, $H_2O_2$, and $O_3$. The suitability of these ions is determined by their ability to prevent the reduction of any ions in the solution, such as copper ($Cu^{2+}$.) Increasing the acidity and having a suitable oxidizing agent present is the method used by the most common metallic impurity removing solution, i.e. SC2.

The second way of removing metallic ions from the oxide surface is to decrease the free metal ion concentration [$M^{x+}$] in the solution. The free metal ion concentration of the solution may be decreased by adding a chelating agent to the solution. The same level of metal ion impurity removal found through the use of the SC2 solution may be achieved though the use of a chelating agent in the SC1 solution (the modified SC1 solution) by meeting two requirements. The first requirement is that the complex of the chelating agent and the bound metal ion remains soluble. The second requirement is that the chelating agent binds to all the metal ions removed from the wafer surface.

Chelating agents may be added to the solution at two distinct points. First, the agents may be added to the SC1 solution itself before the solution is dispensed onto the silicon wafer. Second, the agents may be added to concentrated $NH_4OH$ at the chemical manufacturing plant and shipped as a mixture to the integrated circuit manufacturer. Alternatively, the chelating agents may be added to the $H_2O_2$ at the manufacturing plant. This, however, is less desirable because many chelating agents are slowly oxidized by $H_2O_2$.

The advantages of using chelating agents to remove metallic impurities are that they do not require an acidic environment and that they reduce the overall cleaning time. Other methods of removing metal ions, such as the SC2 solution, require an acidic environment. Traditionally, acidic environments were required for the removal of metal ions therefore requiring that the metal ion removal step be done separately from the SC1 step. This is because the SC1 solution is very alkaline. Chelating agents work in very alkaline environments, allowing them to be added to the SC1 solution. By combining the metal ion removal with the SC1 cleaning step the overall cleaning time is reduced by eliminating the SC2 step. In the traditional SC1-SC2 cycle each step took about ten minutes. Because this cycle is typically repeated many times in the front end of semiconductor processing, the combination of the steps will dramatically reduce the cleaning time.

Figure 1A:
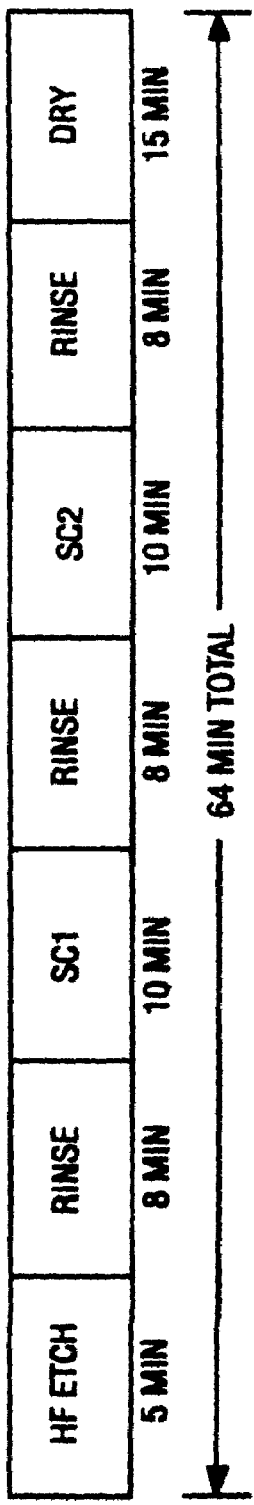
FIG. 1a is a time-line showing the traditional HF-SC1-SC2 wet bench procedure for an oxide etch and a hydrophilic clean (RCA clean.)

In an alternate embodiment the cleaning solution contains a surfactant. The purpose of the surfactant is to prevent reattachment or redeposition of particles on the wafer after they have been dislodged from the wafer. Preventing the reattachment of the particles is important because allowing the particles to reattach increases overall cleaning times. Therefore the surfactant is used to reduce the cleaning time and to make single wafer cleaning possible in less than two minutes as compared to 64 minutes in a batch type method (see FIG. 1a and FIG. 1b)

Figure 5:
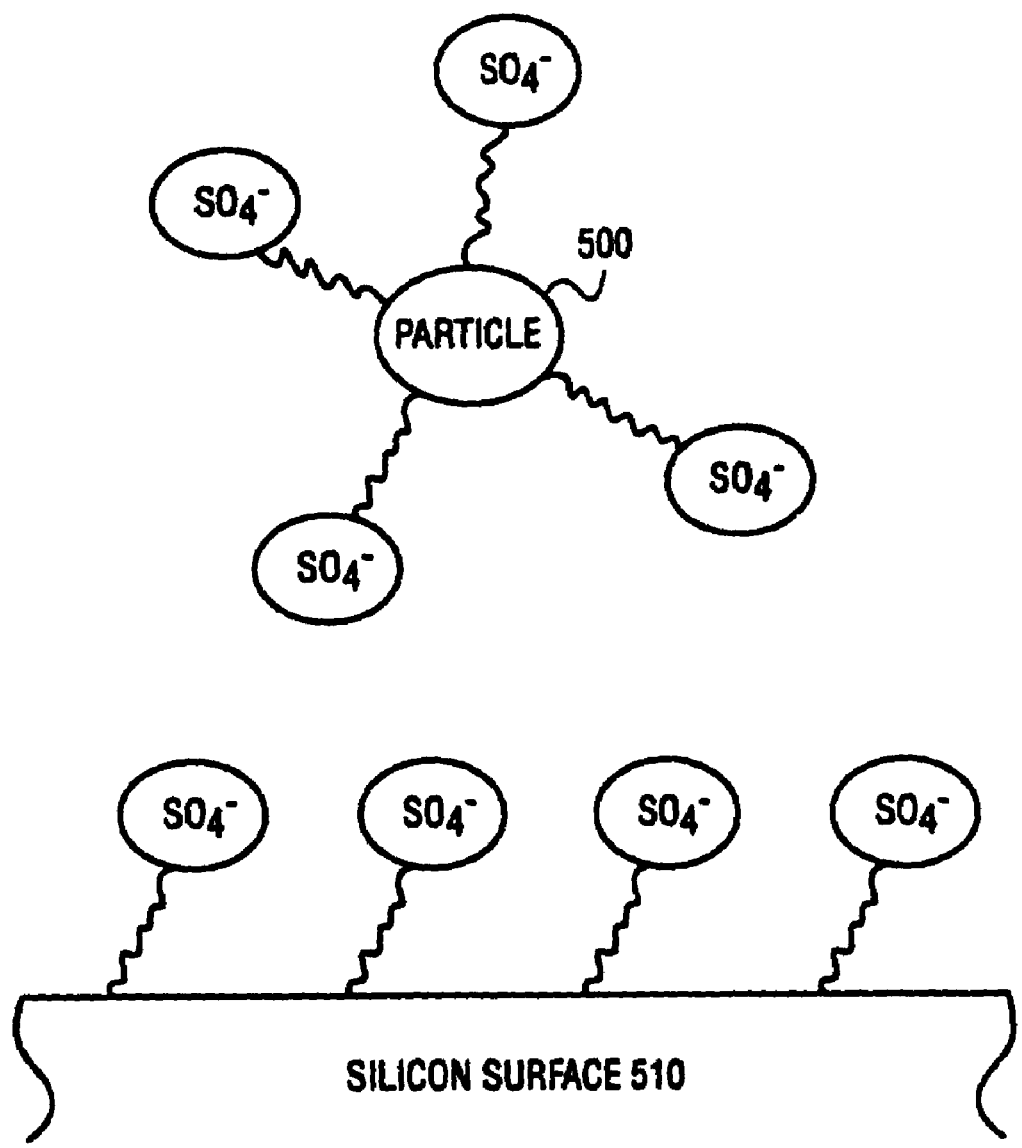
FIG. 5 is an illustration showing the surfactant attached to a particle in solution and to the surface of a wafer.

Surfactants are long hydrocarbon chains that typically contain a hydrophilic (polar water soluble group) and a hydrophobic group (a non-polar water insoluble group). The surfactants attach with their non-polar group to particles 500 (FIG. 5) as well as to the surface of the wafer 510. As a result the polar group of the surfactant 520 will point away from the wafer and away from the particles 500 towards the solution. Because of this the particles in the solution that are bound by the surfactant will be repelled electrostatically from the surface of the wafer because of the polar groups of the surfactant on both the particles and the surface of the wafer as in FIG. 5. The surfactant in the present invention is non-ionic, anionic, or a mixture of non-ionic and anionic compounds. Non-ionic means that the polar end of the surfactant has an electrostatic rather than an ionic charge and anionic means that the polar end of the surfactant has a negative ionic charge. In an embodiment of the present invention the surfactant is a mixture of non-ionic and anionic surfactants. The nonionic surfactant is polyoxyethylene butylphenyl ether and the anionic surfactant is polyoxyethylene alkylphenyl sulfate. In this embodiment, there are approximately 30 ppm of nonionic surfactant and approximately 30 ppm of anionic surfactant in the cleaning solution. A typical concentration range of the surfactant in the cleaning solution can be between 1-100 ppm. In an embodiment of the present invention the surfactant is an anionic compound called MCX-SD2000 manufactured by Mitsubishi Chemical Corporation of Tokyo Japan. MCX-SD2000 is around 1-10% surfactant and is used in a 0.05% concentration by volume in the cleaning solution.

Figure 6A:
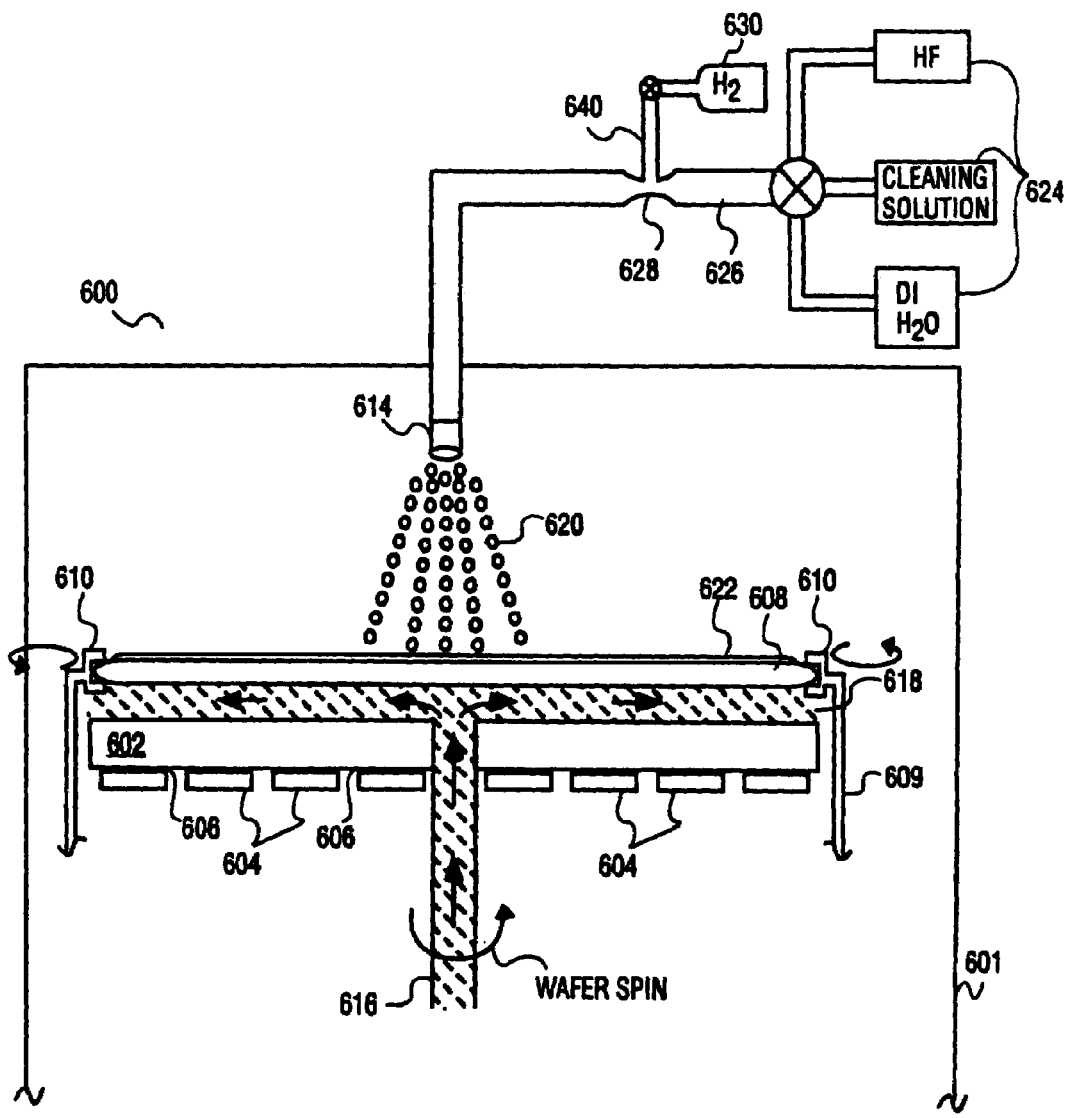
FIG. 6a is an illustration of a cross-sectional view of a single wafer cleaning apparatus.
Figure 6B:
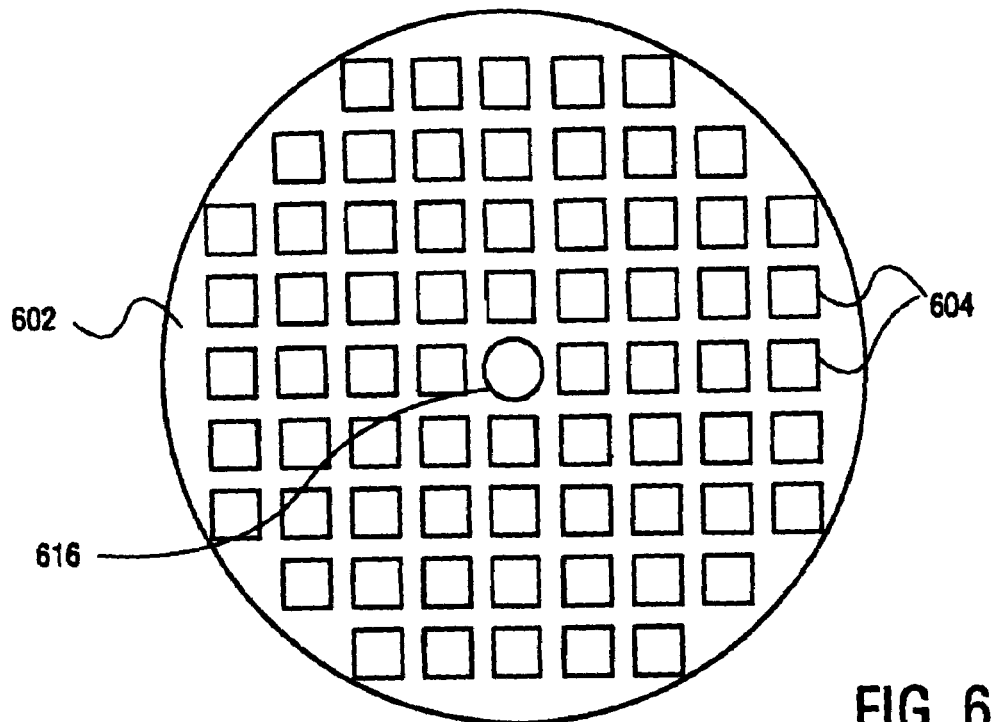
FIG. 6b is an illustration showing the covering of the entire surface area of a plate with transducers.

The cleaning solution of the present invention is ideal for use in a single wafer cleaning apparatus that utilizes acoustic or sonic waves to enhance a cleaning, such as apparatus 600 shown in FIG. 6a. Single wafer cleaning apparatus 600 shown in FIG. 6a includes a plate 602 with a plurality of acoustic or sonic transducers 604 located thereon. Plate 602 is preferably made of aluminum but can be formed of other materials such as but not limited to stainless steel and sapphire. The plate is preferably coated with a corrosion resistant fluoropolymer such as Halar. The transducers 604 are attached to the bottom surface of plate 602 by an epoxy 606. In an embodiment of the present invention the transducers 604 cover substantially the entire bottom surface of plate 602 as shown in FIG. 6b and preferably cover at least 80% of plate 602. In an alternate embodiment of the present invention there are four transducers 604 covering the bottom surface of plate 602 in a quadrant formation and preferably covering at least 80% of plate 602. The transducers 604 preferably generate megasonic waves in the frequency range above 350 kHz. The specific frequency is dependent on the thickness of the wafer and is chosen by its ability to effectively provide megasonics to both sides of the wafer. But there may be circumstances where other frequencies that do not do this may be ideal for particle removal. In an embodiment of the present invention the transducers are piezoelectric devices. The transducers 604 create acoustic or sonic waves in a direction perpendicular to the surface of wafer 608.

Figure 6C:
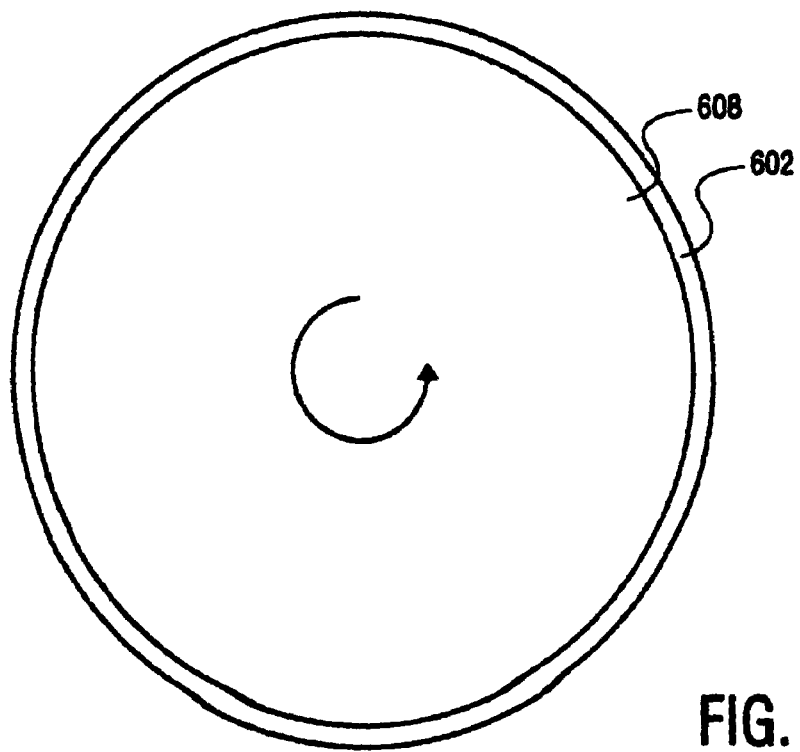
FIG. 6c is an illustration showing how the transducers covered plate of FIG. 6b covers the entire surface area of a wafer being cleaned.

A substrate or wafer 608 is horizontally held by a wafer support 609 parallel to and spaced-apart from the top surface of plate 602. In an embodiment of the present invention, wafer 608 is held about 3 mm above the surface of plate 602 during cleaning. In an embodiment of the present invention, the wafer 608 is clamped face up to wafer support 609 by a plurality of clamps 610. Alternatively, the wafer can be supported on elastomeric pads on posts and held in place by gravity. The wafer support 609 can horizontally rotate or spin wafer 608 about its central axis at a rate of between 0-6000 rpms. Additionally, in apparatus 600 wafer 608 is placed face up wherein the side of the wafer with patterns or features such as transistors faces towards a nozzle 614 for spraying cleaning chemicals thereon and the backside of the wafer faces plate 602. Additionally, as shown in FIG. 6c the transducer covered plate 602 has a substantially same shape as wafer 608 and covers the entire surface area of wafer 608. Apparatus 600 can include a sealable chamber 601 in which nozzle 614, wafer 608, and plate 602 are located as shown in FIG. 6a.

In an embodiment of the present invention DI water (DI-$H_2O$) is fed through a feed through channel 616 of plate 602 and fills the gap between the backside of wafer 608 and plate 602 to provide a water filled gap 618 through which acoustic waves generated by transducers 604 can travel to substrate 608. In an embodiment of the present invention the feed channel 616 is slightly offset from the center of the wafer by approximately 1 mm. The backside of the wafer may alternately be rinsed with other solutions during this step. In an embodiment of the present invention DI water fed between wafer 608 and plate 602 is degassed so that cavitation is reduced in the DI water filled gap 618 where the acoustic waves are strongest thereby reducing potential damage to wafer 608. $DiH_2O$ can be degassed with well known techniques at either the point of use or back at the source, such as at facilities. In an alternative embodiment of the present invention, instead of flowing $DiH_2O$ through channel 616 during use, cleaning chemicals, such as the cleaning solution of the present invention can be fed through channel 616 to fill gap 618 to provide chemical cleaning of the backside of wafer 608, if desired.

Figure 6D:
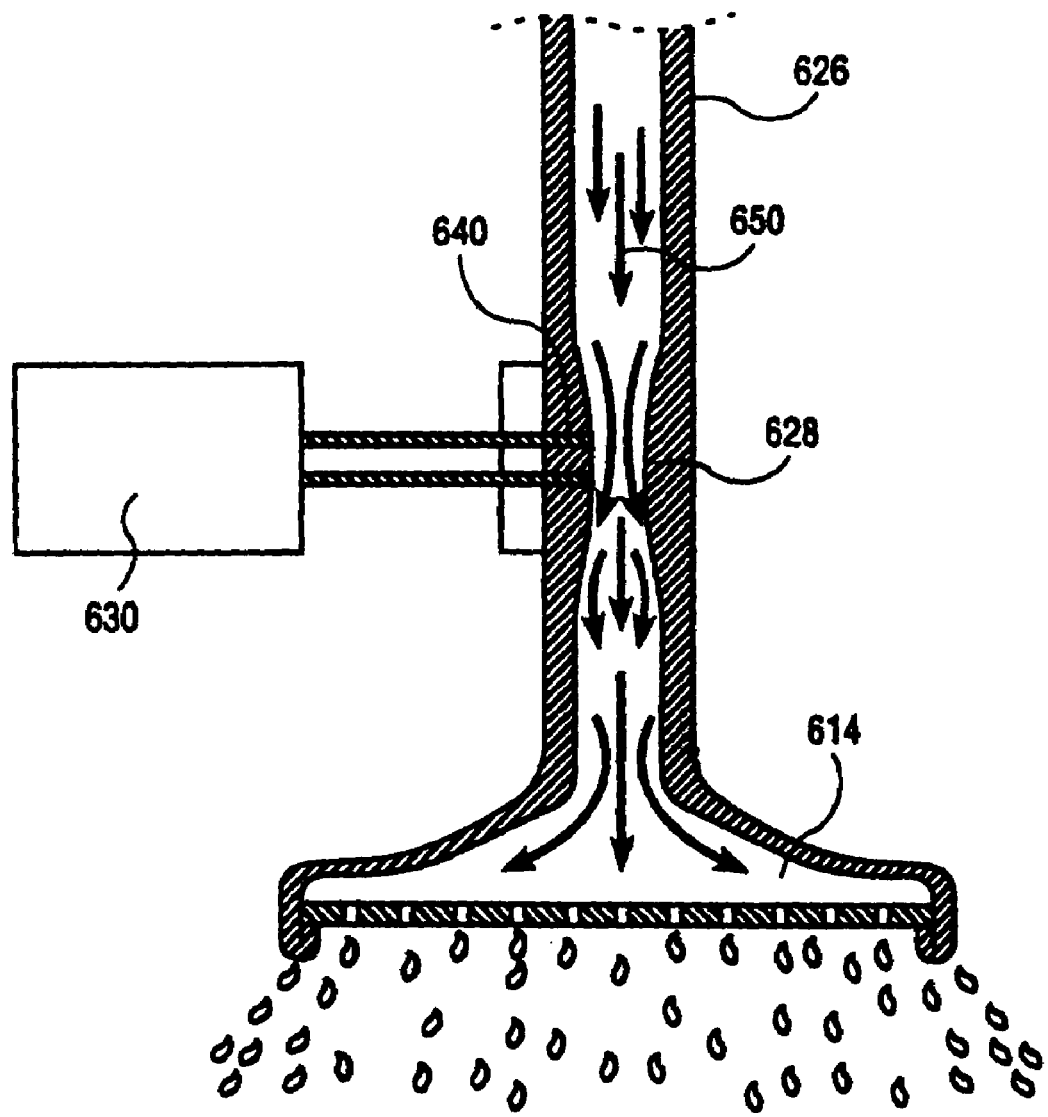
FIG. 6d is an illustration showing a close-up the venturi device that can be used in the single wafer cleaning apparatus.
Figure 7A:
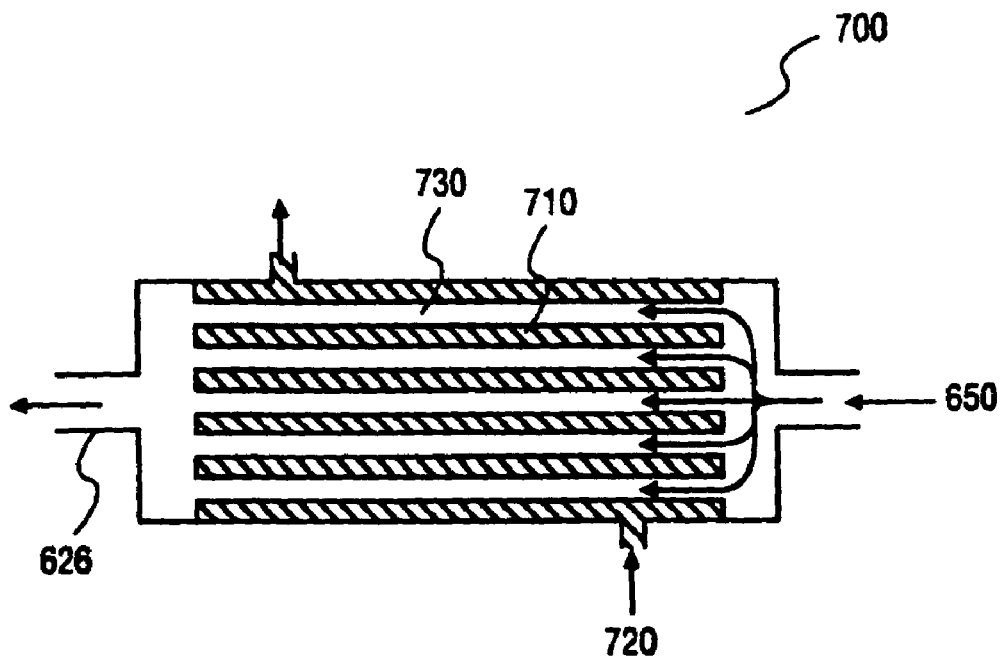
FIG. 7a is an illustration of a membrane device that can be used in the single wafer cleaning apparatus.

Additionally during use, cleaning chemicals and rinsing water such as $DiH_2O$ are fed through a nozzle 614 to generate a spray 620 of droplets that form a liquid coating 622 on the top surface of wafer 608 while wafer 608 is spun. In the present invention the liquid coating 622 can be as thin as 10 micro meters. In the present invention tanks 624 containing cleaning chemicals such as diluted HF, de-ionized water (DI-$H_2O$), and the cleaning solution of the present invention are coupled to conduit 626 which feeds nozzle 614. In an embodiment of the present invention the diameter of conduit 626 has a reduced cross-sectional area or a "venturi" 628, that is shown in more detail in FIG. 6d, in a line before spray nozzle 614 at which point a gas from tank 630 that travels through conduit 640, such as $H_2$, is dissolved in the cleaning solution 650 as it travels to nozzle 614. "Venturi" 628 enables a gas to be dissolved into a fluid flow 650 at gas pressure less than the pressure of the liquid flowing through conduit 626. The Venturi 628 creates under pressure locally because of the increase in flow rate at the Venturi. In an alternate embodiment gases are dissolved into the cleaning solution by a hydrophobic contactor device 700 as shown in FIG. 7a. This contactor device 700 is put into the conduit 626. Contactor device 700 has a hydrophobic membrane conduit 710 which allows gasses to pass through but not water. Gas 720 is fed into membrane conduit 710 where the gas dissolves into the liquid passing through the area 730.

Additionally, if desired, apparatus 600 can include a second nozzle (not shown) separate from nozzle 614 for blowing $N_2$ gas and/or isopropyl alcohol (IPA) vapor onto the frontside of wafer 608 during rinsing and/or drying steps. An IPA vapor can be formed by passing $N_2$ gas through a bubbler containing IPA. Such a process will typically produce a vapor of approximately 4% IPA in $N_2$. Additionally, the distance which wafer 608 is held from plate 602 by wafer support 609 can be increased (by moving either support 609 or plate 602) to free the backside of the wafer 608 from liquid filled gap 618 to enable the wafer to be rotated at very high speed, such as during drying operations. Set forth below are four embodiments of the present invention in the front end of wafer processing where the use of the single wafer cleaning process is particularly useful. A first embodiment is when a hydrofluoric acid wash is used to strip the oxide surface of a wafer. A second embodiment is when it is desired to make the surface of the wafer hydrophobic. A third embodiment is after an $O_2$ ashing. A fourth embodiment is when it is desired to remove all aluminum and/or iron contamination from the surface of the wafer. In each of these embodiments the entire cleaning process including rinsing and drying takes less than two minutes and the cleaning step where the cleaning solution is used takes less than 30 seconds. In each case, the wafer will typically include an outer silicon surface, such as but not limited to a monocrystalline silicon substrate, an epitaxial silicon film, and a polycrystalline silicon (polysilicon) film. A thin oxide film, such as a sacrificial oxide or a native oxide is typically formed on the outer silicon surface. It is to be appreciated, however, that the cleaning process of the present invention can be used to clean other types of wafers and substrates, such as but not limited to gallium arsinide (GaAs) wafers.

Figure 8:
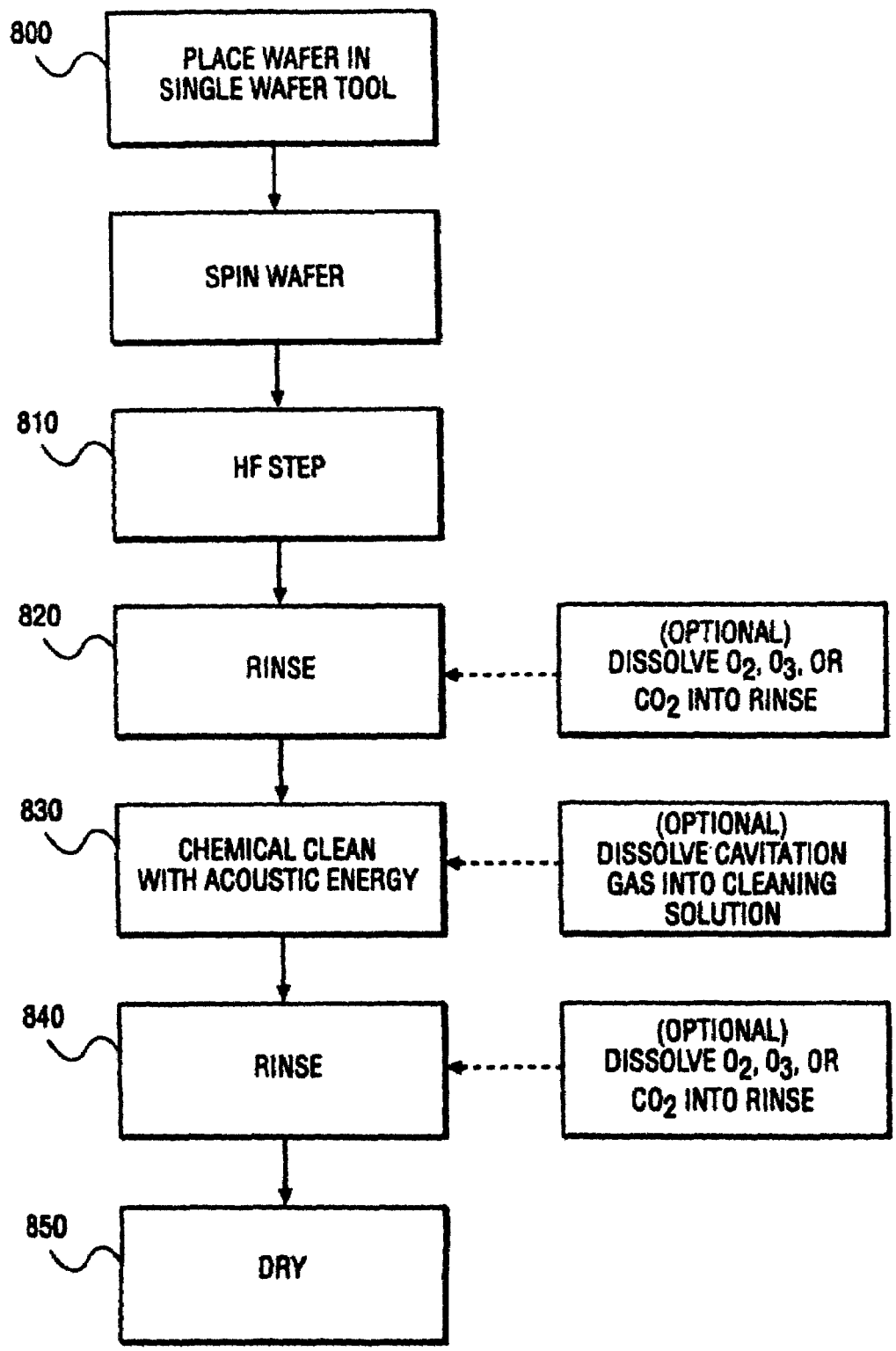
FIG. 8 is a flow-chart of the first embodiment of an HF etch and cleaning process for use in a single wafer cleaning apparatus.

The first embodiment of the present invention where the use of the single wafer cleaning tool and process is particularly useful is a combination of using hydrofluoric acid (HF) to strip an oxide surface of a wafer and using the modified cleaning solution as described above to clean the wafer in less than two minutes. This application is illustrated by a flowchart in FIG. 8. In the first step 800 the wafer is placed in the single wafer cleaning tool. A substrate or wafer requiring cleaning is clamped face up to wafer support 610. Next, the wafer is subjected to an HF step 810. During the HF step 810 the wafer is spun at a rate between 10-2000 rpm, and preferably 100-1000 rpm, as diluted HF is fed through nozzle 614 and sprayed onto the top surface of wafer 608 to form an HF solution cover 622 over the entire front side of wafer 608. The HF solution may have a concentration in the range of 5-1000 parts water to one part HF. The HF solution is comprised of preferably 50 parts DI water to one part HF. The HF that is diluted in the HF solution is typically purchased from the manufacturer as 49% w/w HF to water. The wafer is exposed to the HF solution for between 20-50 seconds, and preferably 30 seconds. The wafer is exposed to the HF solution for a time sufficient to etch either a sacrificial oxide (typically around 50-200 Å) or a native oxide (typically around 10 Å.) Simultaneously to feeding HF onto the top of the wafer, water or HF is fed through feed 616 to fill the gap between the backside of wafer 608 and plate 602 to clean the backside of the wafer. Other solutions can be used here on the backside of the wafer. Alternatively to HF (Hydrofluoric acid), BHF (Buffered Hydrofluoric acid) can be used. Additionally, if desired, a voltage can be applied to the transducers 604 to send megasonic waves through plate 602, through water filled gap 618, through wafer 608 and into coating 622 during the HF step.

After between 20-50 seconds the flow of HF is stopped and the wafer is exposed to a DI water rinse step as set forth in step 820. During the DI water rinse step 820 DI water is fed through nozzle 614 while wafer 608 is rotated at between 10-1000 rpm and transducers 604 are optionally active to rinse wafer 608. The rinse temperature is typically approximately between 19-23° C., and may be heated. During the water rinse step 820, the backside of wafer 608 can also be rinsed by flowing DI water into gap 618.

Prior to being fed through nozzle 614 the DI water rinse can be oxygenated or ozonated at point of use by dissolving $O_2$ or $O_3$ gas into the rinse water. This may be done with a venturi device as described above (FIG. 6d) or with a membrane device as described above (FIG. 7a). Dissolved oxygen ($O_2$) or ozone ($O_3$) is added to the rinse in a concentration of greater than 1 ppm to serve as an oxidant. Alternatively $H_2O_2$ may be added to the rinse in a concentration of greater than 100 ppm to serve as an oxidant. Whichever oxidant is used, it should have an oxidation potential sufficient to oxidize the most noble metal in the solution. Copper (Cu2+), with a standard reduction potential of 0.3V, is usually the most noble metal present. Therefore a standard reduction potential of greater than 0.5V is desired. $O_2$ or $O_3$ will solvate the metal ions and prevent precipitation by oxidizing the metal ions that are in solution. This will help decrease the processing time by making the rinsing more effective. The use of ozone or oxygen is also efficient and cost effective. In an embodiment of the present invention, the DI rinse water is degassed prior to dissolving $O_2$ or $O_3$ into the rinse water.

Ozonated water can be formed by dissolving ozone ($O_3$) in degassed water or DI water. Ozone is generated at point-of-use from oxygen by passing oxygen through two discharge plates. One of the discharge plates is covered with an insulator and an alternating current is applied to the discharge plates. The alternating current creates small discharges between the plates that will form ozone from the oxygen passing through the plates. The preferred concentration of dissolved ozone is between 1 ppm and 200 ppm, and most preferably between 2 ppm and 20 ppm. Alternatively the rinse may be saturated with the gas. Oxygenated water is formed by dissolving oxygen or air into deoxygenated water or DI water. Additionally, although it is preferred to use ozonated or oxygenated DI water during the rinsing of a wafer in a single wafer process, one can also use ozonated or oxygenated DI water in an immersion rinse bath of a batch type tool if desired.

Figure 7B:
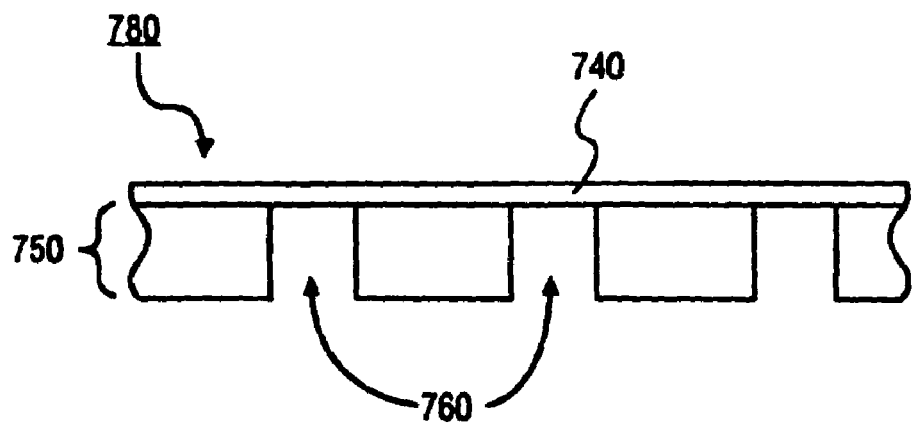
Figure 7C:
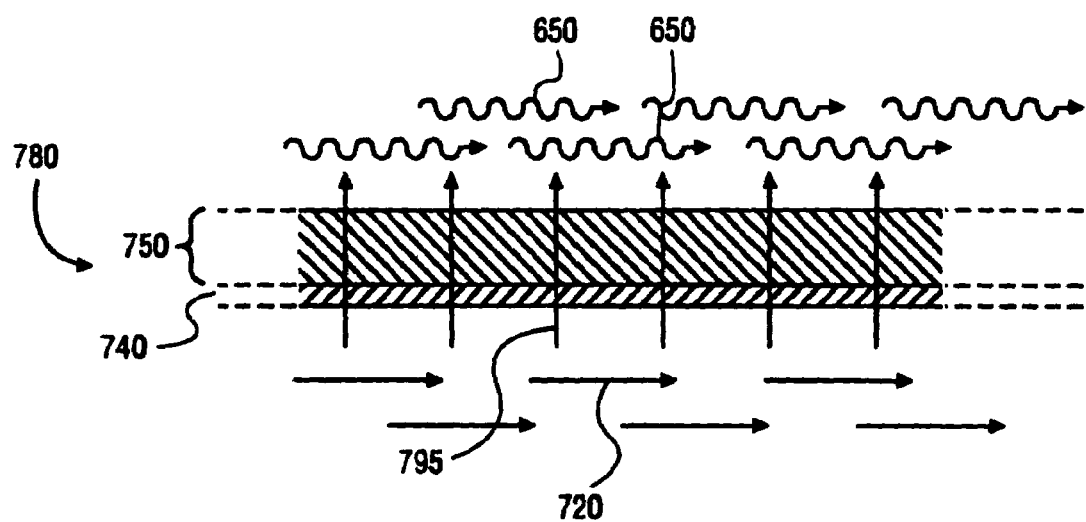
FIG. 7c is an illustration of how the modified membrane works.

In an embodiment of the present invention, prior to being fed through nozzle 114 the rinse may also have $CO_2$ dissolved into it to dissipate static electricity that builds up in the rinse water. Static electricity builds up in the rinse water because of the rotation of the wafer between 10-1000 rpm. Without dissolved $CO_2$ deionized water is resistive, but with dissolved $CO_2$ deionized water is conductive. $CO_2$ also makes the rinse water more acidic and therefore reduces any metallic contamination. The $CO_2$ can be dissolved into the rinse water with a contactor device 700 similar to that shown in FIG. 7a. Contactor device 700 includes a conduit or plurality of conduits 710 formed from a membrane stack 780 shown in FIG. 7b. $CO_2$ gas 720 is fed into the conduit 710 formed of the membrane stack 780. The contactor device 700 also includes spaced-apart areas 730 between the conduit 710 through which DI water 650 flows. In this way, a large surface area is achieved with $CO_2$ gas and DI water. The membrane stack 780 in contactor device 700 is a combination of a porous polymeric membranes 750 and a solid very thin flouropolymer sheet 740, such as a PFA sheet as shown in a cross sectional view in FIG. 7b. The thin solid membrane 740 prevents impurities in the $CO_2$ gas from dissolving into the liquid. The thicker porous membrane 750 acts as a support for the thin membrane 740. The thicker porous membrane 750 has pores 760 on the order of 0.05 um. An example of a suitable contactor device 700, is the Infuzor made by Pall Corporation, Port Washington, N.Y. The polymeric membranes 740 and 750 are impermeable to liquids but permeable to gases. The membrane stack 780 is used to prevent any impurities in the $CO_2$ from ending up in the rinse water. $CO_2$ typically has organic impurities because it is a byproduct of the petroleum industry. The first membrane 740 is a very thin membrane that allows at least $CO_2$ to diffuse through, but does not allow any organic impurities to diffuse through. In an embodiment of the current invention, shown in FIG. 7c, the DI rinse water 650 will flow along the thick membrane 750 and the $CO_2$ gas 720 will flow along the thin membrane 740. The $CO_2$ gas 795, minus any impurities, diffuses through the stacked membrane 780 and dissolves into the DI rinse water 650. In an embodiment of the present invention, $CO_2$ is dissolved into DI water in an amount sufficient to dissipate static electricity. In an embodiment of the present invention, the amount of $CO_2$ dissolved into the DI water is sufficient to decrease the resistivity of the DI water to less than 5 Megaohm.cm. The $CO_2$ may also be dissolved into the rinse water using a venturi device as described above.

The rinse may also have isopropyl alcohol (IPA), or any other liquid with a surface tension lower than that of water, added to it. IPA aids by making the rinse spread out over the surface of the wafer so that the chemicals are removed more quickly. The IPA also helps the rinse spin off of the wafer during spinning. Alternatively, IPA vapor can be blown onto the wafer frontside by a second separate nozzle while rinsing to assist the rinse. The DI water rinse step is meant to remove the chemical from the etching and/or cleaning step and to replace these chemicals with pure DI water. The removal of chemicals from the wafer happens through a combination of convection and diffusion. Closer to the wafer surface, chemicals are removed by the rinsing DI water by diffusion only. The diffusion rate of chemicals close to the wafer surface is dependent upon the boundary layer thickness. The boundary layer thickness can be made small by spinning the wafer at high rotation rates. In an embodiment of the present invention, IPA vapor is directed at the wafer surface. This IPA vapor reduces the boundary layer and pushes the remaining chemicals and DI water away from the surface. This is an very efficient way of shortening the rinse. Additionally, if desired, megasonic energy can be applied while rinsing the wafer in step 820.

After a rinsing sufficient to remove all HF and to stop the etching of the oxide surface (usually between 10-50 seconds, and preferably about 20 seconds) the flow of DI water is stopped. The rinse step is efficient because the centrifugal force created by spinning the wafer helps to quickly remove the rinse.

Next, as set forth in step 830, the wafers are cleaned with the cleaning solution of the present invention. The cleaning solution of the present invention comprising ammonium hydroxide ($NH_4OH$), hydrogen peroxide ($H_2O_2$), water ($H_2O$), a chelating agent such as those discussed above, and a surfactant such as those discussed above, is sprayed by nozzle 614 onto the top surface of wafer 608 in the chemical cleaning step 830. In an embodiment the temperature of the cleaning solution is between 40-85° C. At this time, the back-side of the wafer is also cleaned with the cleaning solution, or alternately with another solution, such as DI water. While the cleaning solution is sprayed onto the wafer 608, the wafer 608 is rotated at a rate between 10-200 rpm to form a thin coating 622 of cleaning solution over the top of wafer 608. Wafer 608 is exposed to the cleaning solution for between 30 and 60 seconds and preferably for a time less than 90 seconds. The transducers 604 produce acoustic waves while flowing the cleaning solution of the present invention onto wafer 608. The transducers 604 produce acoustic waves that travel through plate 602, through liquid filled gap 618, and through wafer 608 and into cleaning solution coating 622 on wafer 608 to enhance the cleaning of wafer 608. It is to be appreciated that the megasonic waves entering the water filled gap 618 also help to clean the backside of wafer 608.

In an embodiment of the current invention a combination of the cleaning solution and megasonics will allow for a dramatic particle and metal contaminant removal. In this embodiment the wafer is exposed to the cleaning solution for approximately 30 seconds and megasonics are applied to the wafer. Before the cleaning step the surface of the wafer can have greater than 1000 contaminant particles that are each larger than 0.1 μm in size. After the cleaning step in this embodiment, the surface of the wafer can have less than 50 contaminant particles that are each larger than 0.1 μm in size. In this embodiment the wafer surface can start out with greater than $1 \times 10^{11}$ metallic atoms/$cm^2$ before the cleaning step, and after the cleaning step the wafer surface can end with less than $1 \times 10^{10}$ metallic atoms/$cm^2$ (excluding aluminum atoms) on the surface of the wafer after the cleaning step.

In an embodiment of the cleaning process of the present invention $H_2$ gas is dissolved into the cleaning solution while the cleaning solution is fed through conduit 126. $H_2$ gas is dissolved into the cleaning solution to provide cavitation (bubble creation) to the cleaning solution coating 122 on the wafer 108. Providing cavitation to the cleaning solution of the present invention enhances the cleaning of the top surface of wafer 108. Although $H_2$ is the preferred gas other suitable cavitation gases such as nitrogen ($N_2$), helium (He), Argon (Ar) or oxygen ($O_2$) can also be used. Dissolving a gas into the cleaning solution accelerates cleaning processes that utilize acoustic or sonic waves to enhance cleaning. Dissolving gas molecules into the cleaning solution makes acoustic enhancement more efficient by improving the cavitation behavior of the cleaning solution. In the present invention between 0.01 to 20 mg/l of $H_2$ is dissolved into the cleaning solution, and most preferably about 0.1 to 5 mg/l of $H_2$. Alternatively, between 1 and 20 mg/l of $O_2$ can be dissolved into the cleaning solution.

After sufficient cleaning of wafer 608 in step 830 the flow of the cleaning solution of the present invention is stopped and the wafer rinsed once again with DI water as set forth in rinse step 840. $O_2$ or $O_3$ dissolved in the rinse is especially useful in guaranteeing that all chelating agents and surfactants are removed during this rinse step. $O_2$ or $O_3$, as well as $H_2O_2$, may be added to the rinse as described above to serve as an oxidant. $CO_2$ and isopropyl alcohol (IPA) may also be dissolved in this rinse as described above. The backside of the wafer can also be rinsed at this time by flowing $DiH_2O$ into gap 618. The wafer is rinsed for around 20 seconds or more. The rinsing step after the cleaning solution is meant to remove all the chemicals from the wafer surface, i.e. ammonium hydroxide, hydrogen peroxide, the chelating agent, and surfactants.

Figure 1B:
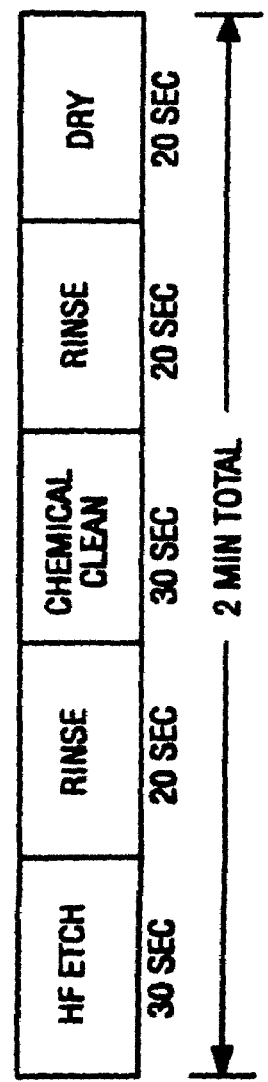
FIG. 1b is a time-line showing the cleaning process of the current invention for an oxide etch and hydrophilic clean in a single wafer cleaning tool.

Next, as set forth in step 850, the wafer is dried. The wafer is then dried by spinning at very high rotation speeds between 100-6000 rpm, preferably around 3000 rpm, for about 20 seconds and using the air flow around the wafer to dry the wafer. If desired, $N_2$ and/or IPA vapor may be blown on the wafer to assist in drying the wafer. Typically, the rotation rate of the wafer during the drying step is greater than the rotation rate of the wafer during the rinse step. After drying, the wafer is then removed from the single wafer cleaning tool. The above described process of the present invention is able to complete a full cleaning cycle including HF etching, rinsing, chemical cleaning, rinsing, and drying in less than three minutes and preferably in less than two minutes as illustrated in FIG. 1b. The clean wafer can then undergo a high temperature thermal process step, typically greater than 400° C., such as but not limited to a gate oxidation step, a chemical vapor deposition (CVD) step, or an anneal step.

Figure 9:
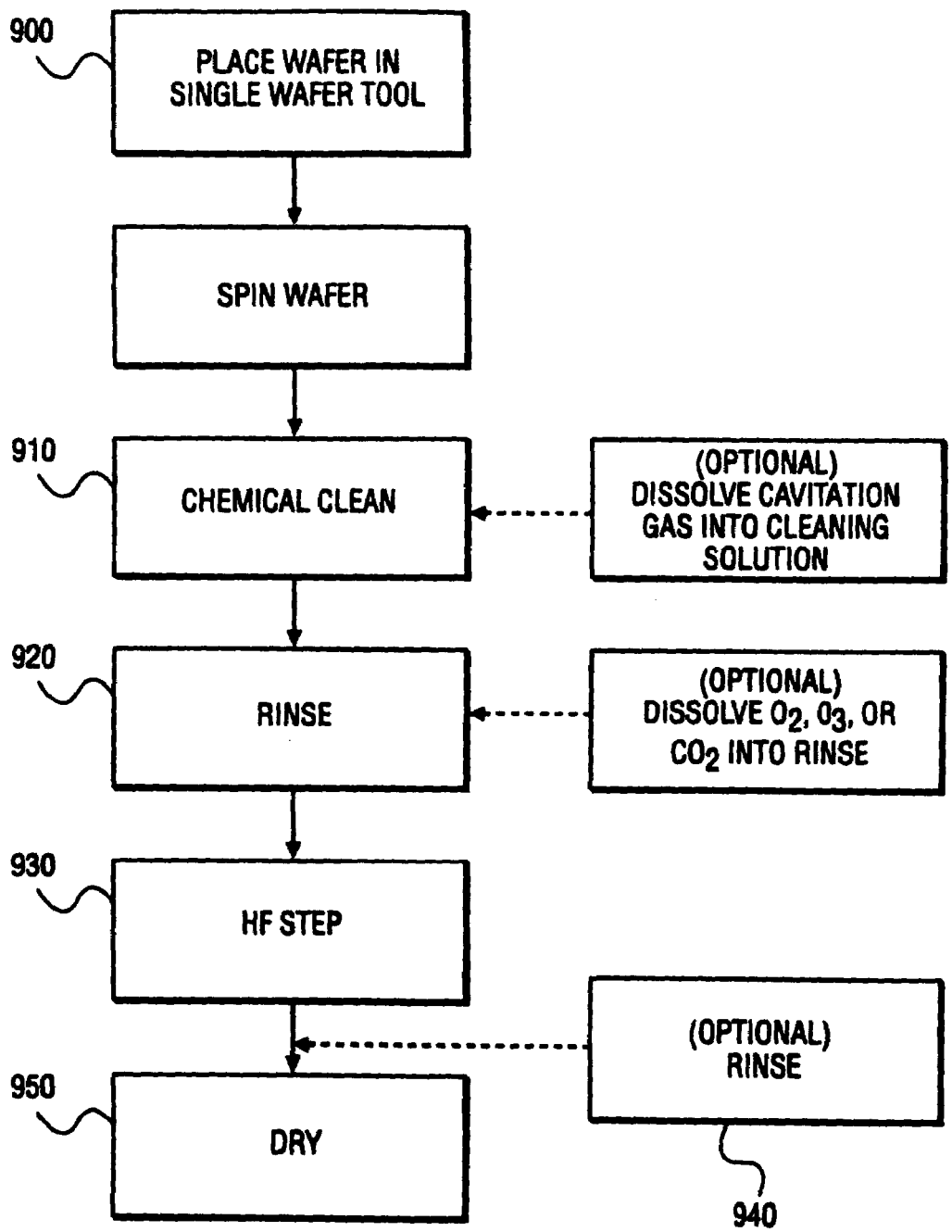
FIG. 9 is a flow-chart of the second embodiment of an HF etch and cleaning process for use in a single wafer cleaning apparatus.
Figure 10A:
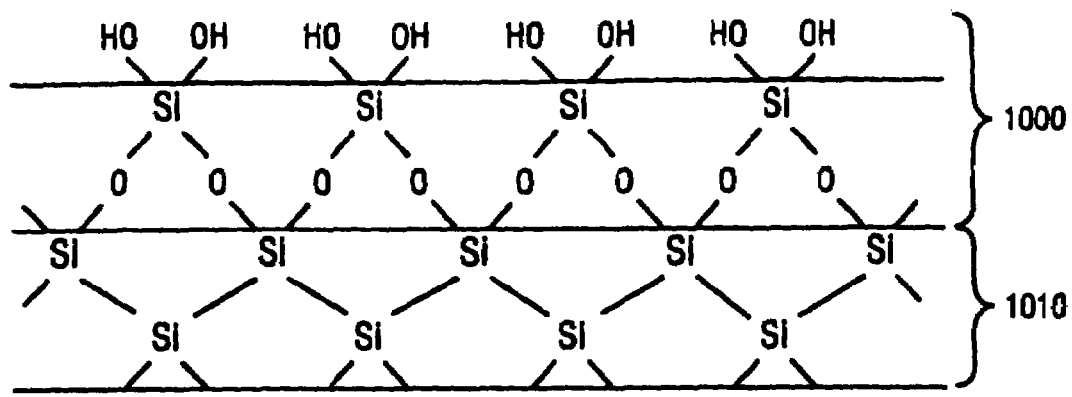
FIG. 10a is an illustration of a silicon wafer with an oxide layer before an HF etching step.
Figure 10B:
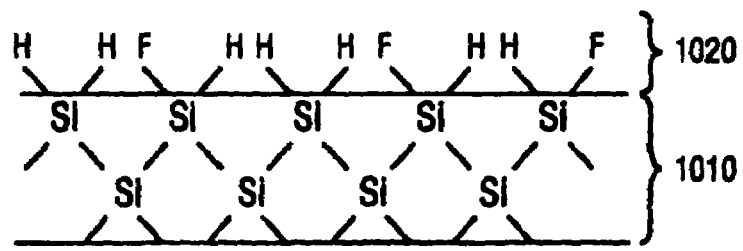
FIG. 10b is an illustration of a silicon wafer with a hydrophobic silicon surface after an HF etching step.

The second embodiment of the current invention, shown in FIG. 9 in flow chart form, is a process which can be used to make the surface of the wafer hydrophobic. Instead of performing the HF step and then the chemical cleaning step, as set forth in FIG. 8, this process places the cleaning step before the HF step. Performing the HF step after the cleaning step leaves the surface of the wafer hydrophobic at the end of the cleaning process. All of the same details as described above with respect to FIG. 8 apply to the respective steps in the current process. The wafer is first placed in the single wafer cleaning tool by clamping the wafer face up to wafer support 610 (step 900.) The wafer is then spun as described above. The cleaning solution of the present invention, that optionally contains a cavitation gas, is then fed through nozzle 614 onto the top surface of wafer 608 as set forth in chemical cleaning step 910. Next, the wafer is rinsed in step 920 with a rinse that optionally contains an oxidant and/or $CO_2$ as described above. Megasonics may also be applied during the rinse. Once rinsed, a HF solution is dispensed onto the wafer in HF step 930. This solution will strip the silicon dioxide layer 1000 (FIG. 10a) from the pure silicon surface 1010. After the HF step 930, the pure silicon surface looks like FIG. 10b. The silicon surface 1010 in FIG. 10b is hydrophobic because of the hydrogen and fluorine termination groups. After the HF step 930 there is an optional rinse step 940. A hydrophobic surface, e.g., is useful when either a cobalt sputter or gate oxidation is done after the cleaning process. After the last wet step (either the HF step 930 or the rinse step 940) the wafer is dried, in drying step 950, in a manner set forth above. The wafer is then removed from the single wafer cleaning tool and processed in another single wafer tool, such as, for example, a cobalt deposition chamber or a gate oxidation chamber.

Figure 11:
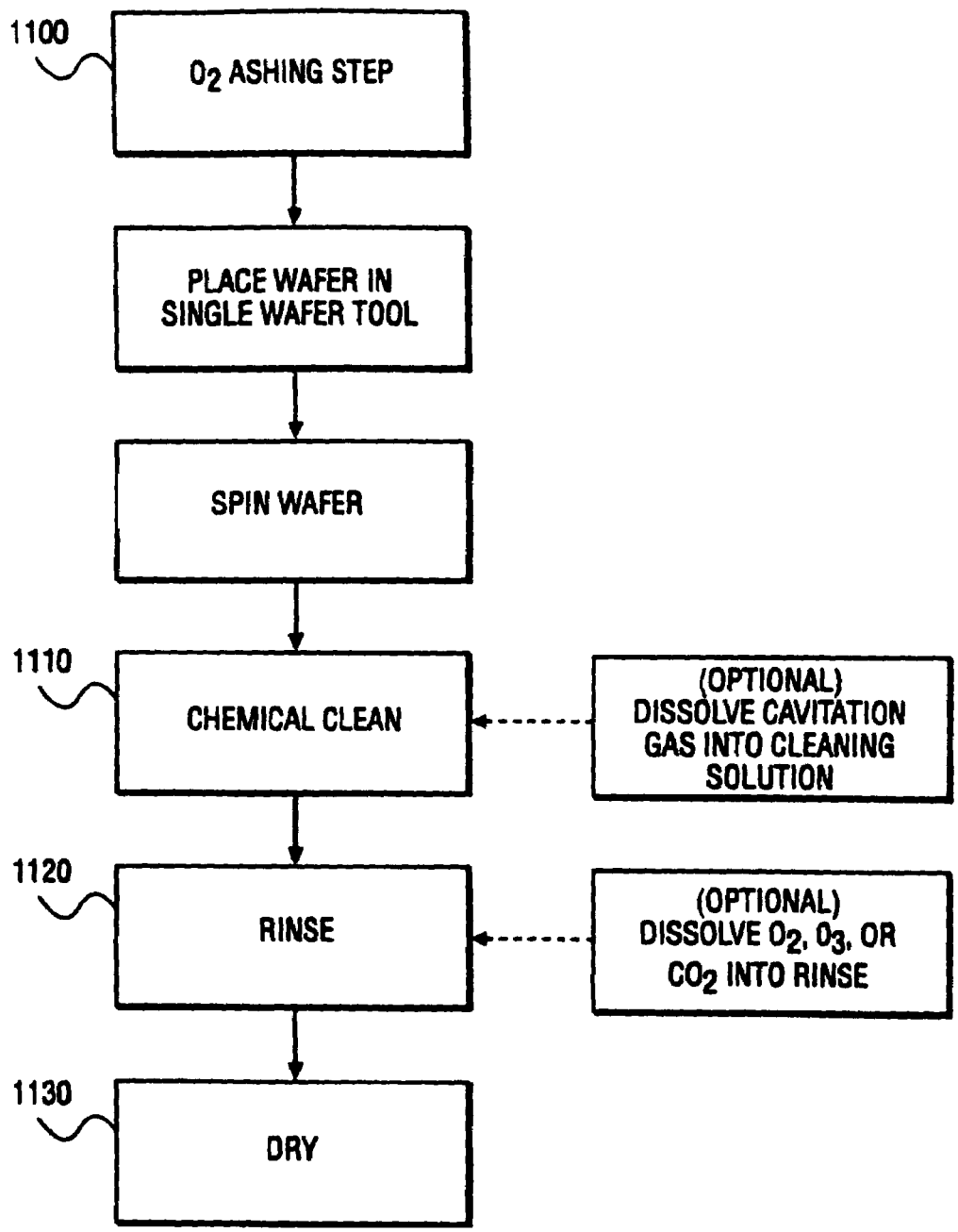
FIG. 11 is a flow-chart of a cleaning process in a single wafer cleaning apparatus after an $O_2$ ashing step.

A third embodiment of the present invention, as shown in the flow chart in FIG. 11, is the use of the single wafer cleaning tool after an $O_2$ ashing of the wafer to remove a photoresist. Most $O_2$ plasma ashing steps are carried out in a single wafer mode and it is therefore very useful to have a single wafer cleaning method instead of a batch cleaning method after a $O_2$ plasma ashing step. All of the same details as described above apply to the respective steps in the current process. The most significant difference in this process compared to the others disclosed in the present invention is that there is no HF step. There is no HF step is because the oxide surface on the wafer is needed in subsequent processing. In this application, after the $O_2$ ashing step 1100, a wafer having an outer oxide film on a silicon surface is placed in the single wafer cleaning tool face up as described above and the wafer is spun. Next, as set forth in chemical cleaning step 1110, the wafer is cleaned with the cleaning solution of the present invention as described above. Megasonic can be applied to the wafer to aid in the cleaning of the wafer. Before dispensation, the cleaning solution may optionally have a cavitation gas dissolved into it. The cleaning solution is then dispensed onto the wafer as the wafer is rotated in step 1110. The cleaning solution removes the ash residue left by the ashing step and removes most metals and chlorine from the surface of the wafer that the ashing does not remove. In this embodiment the cleaning step may exceed 30 seconds. With the elimination of the HF step the cleaning step 1110 may be longer and the entire cleaning process may still be done within two minutes. After the cleaning step, the wafer is rinsed in step 1120 with a rinse solution optionally containing an oxidant and/or $CO_2$ as described above. Next, the wafer is dried in step 1130 by spinning at high speeds as described above. After this cleaning process, where an oxide layer is left on the surface of the wafer, any application where the silicon of the wafer needs to be protected, such as ion implantation, is suitable.

Figure 12:
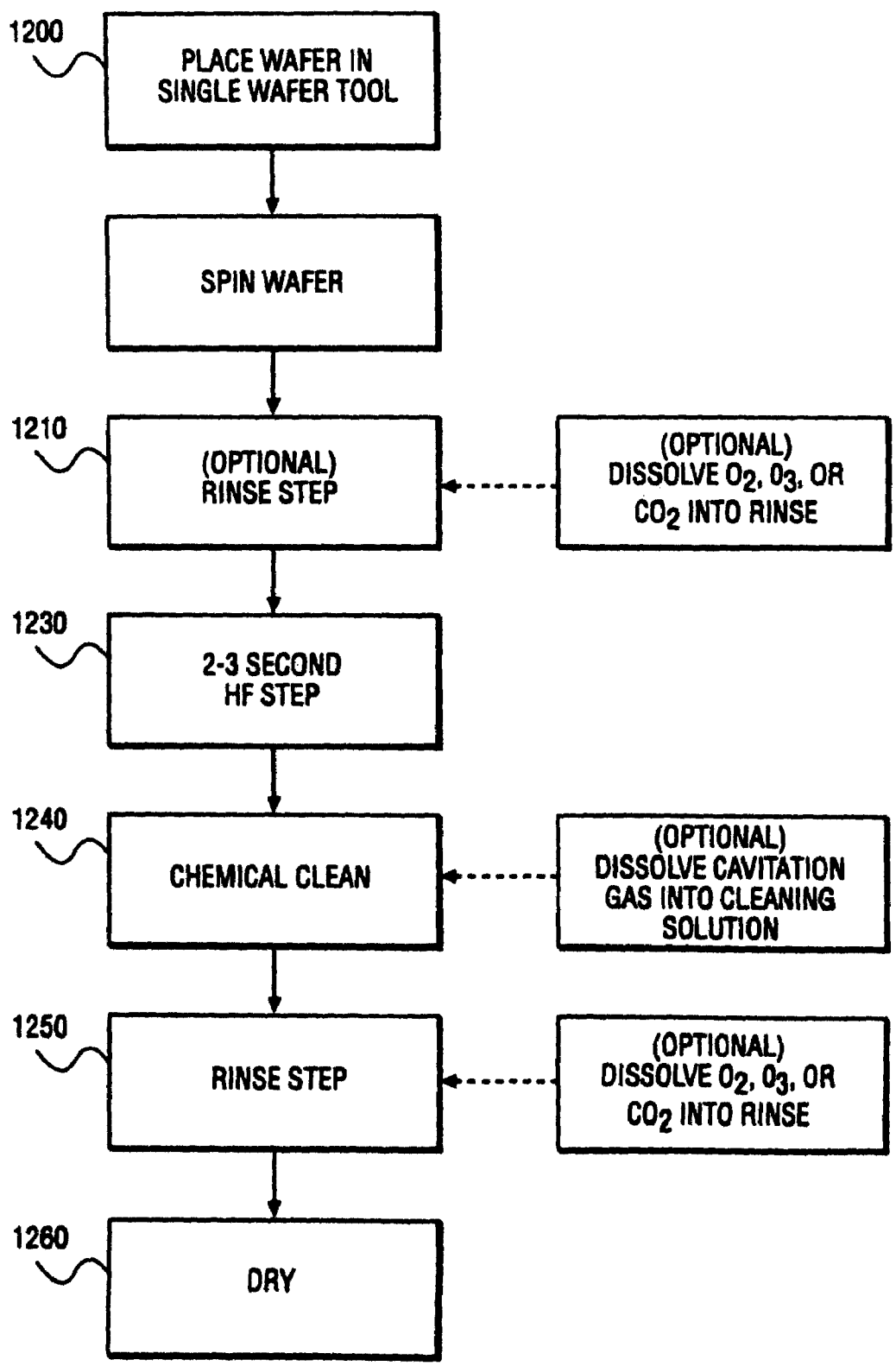
FIG. 12 is a flow-chart of a cleaning process employing a short HF etching step.

In the fourth embodiment of the present invention the single wafer cleaning tool is used to remove all aluminum and iron contamination from the surface of the wafer. An embodiment of this invention is shown in the flow charts of FIG. 12. This embodiment uses a very short HF step that etches away only about 0.5-5 Å of a thermal oxide on the wafer silicon surface. This quick etching in combination with the cleaning step will quickly remove all aluminum and iron contamination, as well as any other contaminants, from the surface of the wafer within approximately 30-40 seconds. Without the short HF step, the cleaning solution alone would take approximately 10 minutes to remove all of the aluminum and iron. The wafer can be contaminated with around $2\times10^{11}$ atoms/$cm^2$ of aluminum ions after being in an ion implanter or in an etching chamber. The present cleaning application will reduce that concentration of aluminum and iron atoms to around $1-5\times10^{10}$ atoms/$cm^2$. In the embodiment shown in FIG. 12, the short HF step 1230 is immediately before the cleaning step 1240 and there is no rinse between the HF step 1230 and the cleaning step 1240.

Figure 13A:
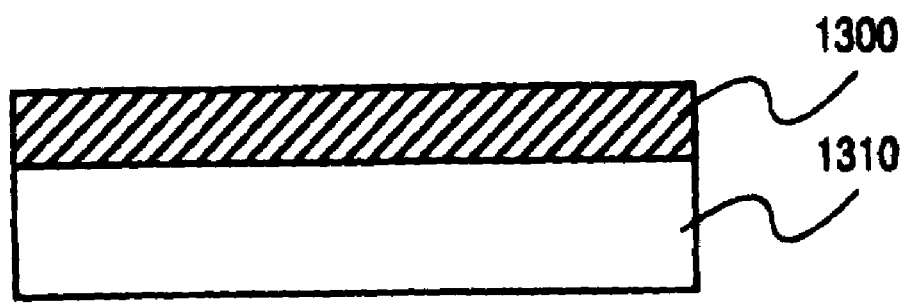
FIG. 13a is an illustration of the silicon dioxide film on a silicon wafer before a short HF etching step and FIG. 13b is the silicon wafer after a short HF etching step.
Figure 13B:
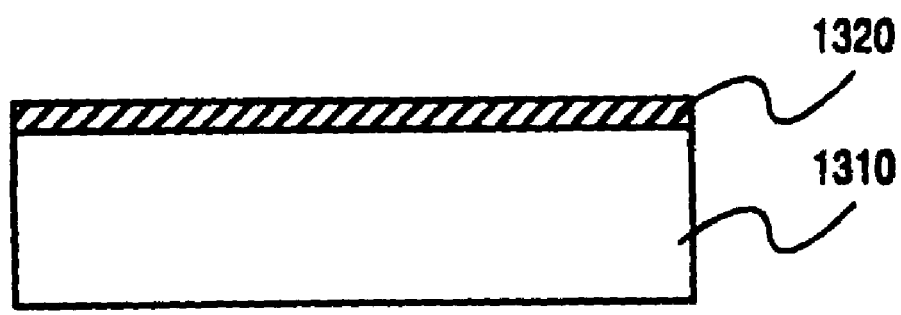

In this embodiment to remove all aluminum contamination from the surface of wafer, the wafer is first placed in a single wafer cleaning tool in step 1200 after being contaminated with aluminum and iron in, for example, either an ion implant chamber or an etching chamber. At this point, as shown in FIG. 13a, there is a thin oxide layer 1300 on the surface of the silicon wafer 1310. Once loaded into the single wafer cleaning tool, the wafer is spun and optionally rinsed. As set forth in step 1210, the optional rinse may optionally contain an oxidant and/or $CO_2$ as discussed above. Megasonics may also be applied during this optional rinse. If no initial rinse is used, then the wafer after being loaded into the single wafer machine is spun and HF is dispensed on the spinning wafer for less than five seconds and preferably for 2-3 seconds as set forth in step 1230. If an initial rinse is used, HF is dispensed for 2-3 seconds on top of the rinse water on top of the spinning wafer. The cleaning solution of the present invention is then immediately dispensed on top of the HF solution on top of the wafer in chemical cleaning step 1240 to produce an HF covered wafer. The cleaning solution consists of a mixture of ammonium hydroxide, hydrogen peroxide in water with a chelating agent added. Additionally, a surfactant may be added as discussed above. The cleaning solution quickly neutralizes the HF solution and stops the etching. Because the cleaning step quickly neutralizes the HF solution, the oxide film 1300 is only slightly etched, and an oxide 1320, as shown in FIG. 13b, which is only 0.05-5 Å thinner remains after the cleaning step in step 1240. Because of the quick neutralization and the elimination of a rinse step, an HF step followed immediately by a cleaning step increases the efficiency of the HF etch quenching. A cavitation gas may optionally be dissolved into the cleaning solution before it is dispensed on the wafer. After the cleaning step 1240 the wafer is rinsed in step 1250 as described above. After the wafer is sufficiently rinsed it is dried in drying step 1260 by spinning the wafer at high speed as set forth above. The wafer is then removed from the chamber and thermally processed in a single wafer furnace. When using a single wafer furnace, it is very useful to have a single wafer cleaning method instead of a batch cleaning method. The thermal processes are typically performed at temperatures exceeding 400° C. The thermal process may be an anneal, a chemical vapor deposition (CVD), or an oxidation. All metals must be removed from the surface of the wafer before any thermal processing steps because the metals will become embedded in the wafer during the thermal processing.

It is to be appreciated that although the cleaning process of the present invention is ideally carried out in an apparatus 600 as shown in FIG. 6a the cleaning process of the present invention can utilize other cleaning apparatuses. For example, the acoustic energy need not necessarily be applied from the bottom of the wafer but can also be applied to the front side. Additionally, the acoustic devices need not necessarily cover the entire surface area of the wafer 600 but may only cover a portion if desired. Still, the acoustic energy can be applied directly to nozzle 614 so that the droplets contained by nozzle 614 contain acoustic waves. In fact, although preferred acoustic energy is not required during cleaning. Similarly, the cleaning solution of the present invention need not necessarily be sprayed onto top surface of the wafer but can also be dispensed onto the wafer by a constant stream of liquid. Furthermore, the cleaning solution can also be supplied at the same time onto the front of the wafer and the backside of the wafer as well as onto the edge. Although ideally situated for a single wafer process, a solution comprising $NH_4OH$, $H_2O_2$, $H_2O$, a chelating agent, and a surfactant, according to the present invention can also be used in an immersion bath for a batch type cleaning process and provide improved cleaning. It is to be appreciated that the disclosed specific embodiments of the present invention are only illustrative of the present invention and one of ordinary skill in the art will appreciate the ability to substitute features or to eliminate disclosed features. As such, the scope of applicant's cleaning solution and cleaning methodology are to be measured by the appended claims that follow.

Thus, a novel cleaning method and solution for use in a single wafer cleaning process have been described.

We claim:

1. A method of preparing a rinse solution comprising:
   using a stacked membrane consisting essentially of a solid membrane on top of a porous membrane;
   passing $H_2O$ along said porous membrane; and
   passing $CO_2$ gas along said solid membrane; and
   diffusing said $CO_2$ gas through said solid membrane and dissolving said $CO_2$ gas into said $H_2O$.

2. The method of claim 1 wherein said $CO_2$ gas contains residual byproduct organic impurities from conversion of petroleum to said $CO_2$ gas, and said diffusing $CO_2$ gas further comprises diffusing said $CO_2$ gas minus said organic impurities through said solid membrane.

3. The method of claim 1 further comprising diffusing said $CO_2$ gas through said solid membrane and dissolving said $CO_2$ gas into said $H_2O$ until said rinse solution has a resistivity less than 5 megaohm.cm.

4. The method of claim 1 further comprising, passing said $H_2O$ through a multiplicity of conduits formed between a multiplicity of said stacked membranes arranged in parallel.

5. The method of claim 4, wherein said $H_2O$ passes along said porous membranes of said multiplicity of stacked membranes.

6. A method of preparing a rinse solution comprising:
   using a first stacked membrane comprising a first solid membrane in contact with a first porous membrane to prepare a rinse solution, wherein said preparation comprises:
   passing $H_2O$ along said first porous membrane;
   passing $CO_2$ gas along said first solid membrane; and
   diffusing said $CO_2$ gas through said first solid membrane and dissolving said $CO_2$ gas into said $H_2O$ until said rinse solution has a resistivity less than 5 megaohm.cm.

7. The method of claim 6 wherein said $CO_2$ gas contains residual byproduct organic impurities from conversion of petroleum to said $CO_2$ gas, and said diffusing $CO_2$ gas further comprises diffusing said $CO_2$ gas minus said residual byproduct organic impurities through said first solid membrane.

8. The method of claim 6 wherein the first stacked membrane consists essentially of a first solid membrane in contact with a first porous membrane.

* * * * *